US008681307B2

(12) United States Patent
Kawasaki

(10) Patent No.: US 8,681,307 B2
(45) Date of Patent: Mar. 25, 2014

(54) INSULATED GATE TRANSISTOR, ACTIVE MATRIX SUBSTRATE, LIQUID CRYSTAL DISPLAY DEVICE, AND METHOD FOR PRODUCING THE SAME

(75) Inventor: Kiyohiro Kawasaki, Hirakata (JP)

(73) Assignee: Sharp Kabushiki Kaisha, Osaka (JP)

( * ) Notice: Subject to any disclaimer, the term of this patent is extended or adjusted under 35 U.S.C. 154(b) by 372 days.

(21) Appl. No.: 13/133,212

(22) PCT Filed: Dec. 16, 2009

(86) PCT No.: PCT/JP2009/070998
§ 371 (c)(1),
(2), (4) Date: Jun. 7, 2011

(87) PCT Pub. No.: WO2010/071159
PCT Pub. Date: Jun. 24, 2010

(65) Prior Publication Data
US 2011/0242464 A1 Oct. 6, 2011

(30) Foreign Application Priority Data
Dec. 19, 2008 (JP) .................. 2008-324391

(51) Int. Cl.
G02F 1/13 (2006.01)
G02F 1/136 (2006.01)
G02F 1/1333 (2006.01)
H01L 21/00 (2006.01)
H01L 21/302 (2006.01)
H01L 21/461 (2006.01)

(52) U.S. Cl.
USPC ............... 349/187; 349/43; 349/46; 349/138; 438/30; 438/691

(58) Field of Classification Search
USPC ............... 349/43, 46, 138, 187, 192; 438/30, 438/689–691
See application file for complete search history.

(56) References Cited

U.S. PATENT DOCUMENTS 6,287,899 B1    9/2001  Park et al.
6,882,394 B2 *  4/2005  Doi et al. ..................... 349/133
7,157,319 B2 *  1/2007  Ishikawa et al. .............. 438/158
(Continued)

FOREIGN PATENT DOCUMENTS

JP    60-103677 A    6/1985
JP    62-040773 A    2/1987
(Continued)

OTHER PUBLICATIONS

Official Communication issued in International Patent Application No. PCT/JP2009/070998, mailed on Mar. 9, 2010.

Primary Examiner — Lucy Chien
Assistant Examiner — Paisley L Arendt
(74) Attorney, Agent, or Firm — Keating & Bennett, LLP

(57) ABSTRACT

According to the insulated gate transistor, a gate electrode (11A) is provided on a main surface of a glass substrate (2); a first part of an insulating layer (gate insulating layer (30) and transparent inorganic insulating layer (60)) is thicker than a second part of the insulating layer (gate insulating layer (30)), the first part being between (i) the gate electrode (11A) and (ii) a source electrode (12) and a drain electrode (21) of the insulated gate transistor, and the second part being between (i) the gate electrode (11A) and (ii) a channel section (31A) of the insulated gate transistor. This makes it possible to reduce parasitic capacitor without deteriorating characteristics of the transistor.

3 Claims, 17 Drawing Sheets

(56) References Cited

U.S. PATENT DOCUMENTS

| | | |
|---|---|---|
| 7,385,651 B2 * | 6/2008 | Nam et al. .................. 349/43 |
| 7,608,541 B2 * | 10/2009 | Yoo et al. .................. 438/689 |
| 2001/0046016 A1 | 11/2001 | Park et al. |
| 2003/0133067 A1 | 7/2003 | Park et al. |
| 2005/0082536 A1 | 4/2005 | Park et al. |

FOREIGN PATENT DOCUMENTS

| | | |
|---|---|---|
| JP | 02-224275 A | 9/1990 |
| JP | 05-013765 A | 1/1993 |
| JP | 2987045 B2 | 12/1999 |
| JP | 2000-206571 A | 7/2000 |

* cited by examiner

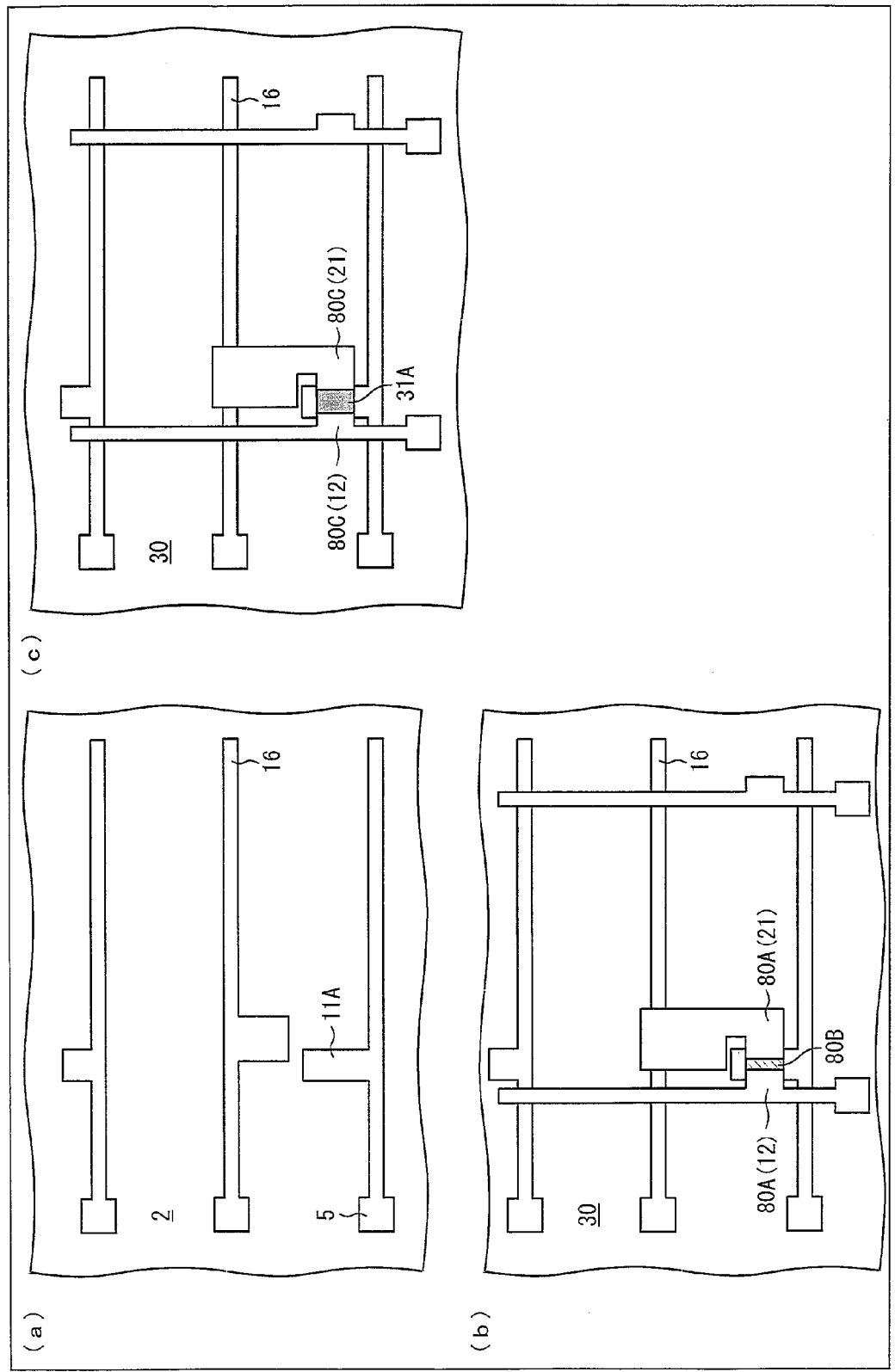
PriorArt
FIG. 16

INSULATED GATE TRANSISTOR, ACTIVE MATRIX SUBSTRATE, LIQUID CRYSTAL DISPLAY DEVICE, AND METHOD FOR PRODUCING THE SAME

TECHNICAL FIELD

The present invention relates to a liquid crystal display device having a function of displaying a color image. In particular, the present invention relates to an active liquid crystal display device having a switching element for each pixel, and an insulated gate transistor included in a device such a liquid crystal display device.

BACKGROUND ART

In these years, a large number of liquid crystal display devices with diagonal screen sizes of 5 cm to 100 cm, which can display television images and various images, have already been provided for commercial purposes, owing to the development in techniques such as a microfabrication technique, a liquid crystal material technique, and a high-density mounting technique. Such a liquid crystal display device can easily achieve a color display with a configuration in which colored layers of R, G, and B are provided on one of two glass substrates which constitute a liquid crystal panel. According to a so-called active matrix liquid crystal panel, switching elements are provided for respective pixels, and therefore the active matrix liquid crystal panel could (i) reduce a crosstalk, (ii) achieve a quick response, and (iii) secure an image with high contrast ratio, from the beginning of its commercialization.

According to the liquid crystal display device (liquid crystal panel), in general, approximately 200 to 1200 scanning signal lines (gate lines) and approximately 300 to 1600 data signal lines (source lines) are provided in a matrix manner. In these years, an increase in a screen size and an increase in definition of the liquid crystal display device are being sought concurrently, in order to address an increase in display capacity.

FIG. 13 is a perspective view illustrating a mounting method of a liquid crystal panel disclosed in Patent Literature 1. An electric signal is supplied to an image display section with a mounding method such as (i) a COG (chip-on-glass) method in which a semiconductor integrated circuit chip 3 is connected with an electrode terminal 5 of a scanning signal line with the use of a conductive adhesive, and a driving signal is supplied from the semiconductor integrated circuit chip 3 to the electrode terminal 5 of the scanning signal line, which is provided on one of transparent insulating substrates (e.g., a glass substrate 2) constituting a liquid crystal panel 1, or (ii) a TCP (tape-carrier-package) method in which a TCP film 4, which is made up of a polyimide resin thin film as a base and has a terminal made up of a gold- or solder-plated copper foil, is compression-bonded on an electrode terminal 6 of a data signal line with the use of an appropriate adhesive agent containing a conductive medium. In FIG. 13, two mounting methods are illustrated together for convenience. However, in practice, any one of the methods is to be selected as appropriate.

Pixels in an image display section, which is disposed substantially in the center of the liquid crystal panel 1, are connected with the electrode terminals 5 and 6 of the respective scanning signal line and the data signal line via respective lines indicated by reference numerals 7 and 8. The lines 7 and 8 do not necessarily need to be made of a conductive material identical to that for the electrode terminals 5 and 6. A reference numeral 9 indicates a counter glass substrate or a color filter which is the other of the transparent insulating substrates. The counter glass substrate or the color filter has a surface which (i) faces the one of the transparent insulating substrates and (ii) is provided with a transparent conductive counter electrode, which is common to all liquid crystal cells.

FIG. 14 is an equivalent circuit diagram illustrating an active liquid crystal display device in which an insulated gate transistor 10 is provided as a switching element for each of pixels. In FIG. 14, a reference numeral 11 (corresponding to the reference numeral 7 in FIG. 13) indicates a scanning signal line, a reference numeral 12 (corresponding to the reference numeral 8 in FIG. 13) indicates a data signal line, a reference numeral 13 indicates a liquid crystal cell, which is electrically addressed as a capacitor element. Elements, which are drawn with solid lines, are provided on a glass substrate 2 which is one of glass substrates constituting the liquid crystal panel 1. A counter electrode (common electrode) 14, which is common to all the liquid crystal cells 13 and is drawn with dotted lines, is provided on a main surface, which faces the glass substrate 2, of a glass substrate 9 which is the other of the glass substrates constituting the liquid crystal panel 1. In a case where (i) OFF resistance of the insulated gate transistor 10 or resistance of the liquid crystal cell 13 is low or (ii) a gradation property of a display image is considered as important, the circuit is modified in such a way that an auxiliary storage capacitor (auxiliary capacitor) 15 is added in parallel with the liquid crystal cell 13 in order to increase a time constant of the liquid crystal cell 13 as a load. Note that a reference numeral 16 indicates a storage capacitor line or a counter electrode which serves as a bus line common to the storage capacitors 15.

FIG. 15 is a cross-sectional view illustrating an essential part of the image display section of the liquid crystal display device. As shown in FIG. 15, the two glass substrates 2 and 9, which constitute the liquid crystal panel 1, are provided so as to be away from each other at a predetermined distance (approximately several micrometers) via a resinous fiber, beads, or a spacer such as a columnar spacer provided on the color filter 9 (these members are note illustrated). The space (gap) between the glass substrates 2 and 9 is an enclosed space which is filled with liquid crystal 17 and sealed with (i) a sealing material made of organic resin and (ii) a sealer (these materials are not illustrated) which are provided in a periphery of the glass substrate 9.

In a case where a color display is to be carried out, an organic thin film (referred to as a colored layer 18), which has a thickness of approximately 1 µm to 2 µm and contains one of or both of dye and pigment, is attached to an enclosed space side of the glass substrate 9 so as to achieve a color display function. In such a case, the glass substrate 9 is also referred to as a color filter (CF). Further, a polarizing plate(s) 19 is(are) provided on one of or both of an upper surface of the glass substrate 9 and a lower surface of the glass substrate 2, depending on a characteristic of the liquid crystal material 17 so that the liquid crystal panel 1 serves as an electro-optic device. At present, most of commercially available liquid crystal panels use a TN (twisted nematic) liquid crystal material, and therefore, in general, it is necessary to provide two polarizing plates 19. According to a transmissive liquid crystal panel, a backside light source is provided as a light source, and white light is emitted from beneath (not illustrated).

Polyimide resin thin films 20 are provided between the liquid crystal 17 and the respective glass substrates 2 and 9. Each of the polyimide resin thin films 20 is an alignment film which (i) has a thickness of, for example, approximately 0.1 µm and (ii) causes liquid crystal molecules to be aligned toward a predetermined direction. The insulated gate transistor 10 has a drain which is connected with a transparent conductive pixel electrode 22 via a drain electrode (drain line) which (i) is indicated by a reference numeral 21 and (ii) is usually formed concurrently with a formation of the data signal line (source line) 12. A semiconductor layer 23 (whose details will be described later) is provided between the source electrode 12 and drain electrode 21. A Cr thin film layer 24 having a thickness of approximately 0.1 μm is provided between any adjacent two colored layers 18 on the color filter 9. Note that the Cr thin film layer 24 is a light-shielding member which prevents external light from entering the semiconductor layer 23, the scanning signal line 11, and the data signal line 12. This configuration has been established as a so-called black matrix (BM) arrangement.

In order to produce an active matrix substrate 71, in which scanning signal lines, data signal lines, insulated gate transistors serving as switching elements, and pixel electrodes are provided on the glass substrate 2, it is necessary to carry out a photolithography (photo-etching) more than once with the use of photomasks, as with a production of a semiconductor integrated circuit. Although detailed background is not described here, (i) an islanding process of a semiconductor layer has been rationalized and (ii) a contact formation process with respect to a scanning signal line has been eliminated. Consequently, the number of required photomasks, which was approximately 7 to 8 at the beginning, has been reduced to 5 nowadays, owing to a dry etching technique. This drastically contributes to a reduction in processing cost. It is known that manufacturing cost of a liquid crystal display device can be effectively reduced by attaining the following object in development, i.e., a reduction in (i) processing cost in producing an active matrix substrate and (ii) material cost in assembling a panel and mounting a module. It is therefore self-evident that a reduction in production processes including a photo-etching process drastically contributes to (i) improvement in productivity of a liquid crystal display device and (ii) a reduction in cost.

In general, it is necessary to carry put the photo-etching process five times in producing the active matrix substrate 71 as described above. With regard to this, Patent Literature 2 discloses a production method which enables a further reduction in manufacturing cost. The following describes a four-mask process disclosed in Patent Literature 1. The four-mask processing achieves rationalization or a reduction in processes by carrying out (i) an islanding process of a semiconductor layer having a channel and (ii) a source and drain wiring process with the use of a single photomask, by a halftone exposure technique.

FIGS. 16 and 17 are plane views each of which illustrates a unit pixel of an active matrix substrate being prepared by the four-mask process. FIGS. 18 and 19 are cross-sectional views which (i) correspond to manufacturing processes shown in FIGS. 16 and 17 and (ii) are taken along lines corresponding to the line A-A' (insulated gate transistor area), the line B-B' (electrode terminal area of scanning signal line), and the line C-C' (electrode terminal area of data signal line) in (b) of FIG. 17. Specifically, (a) of FIG. 16 through (c) of FIG. 16 correspond to the respective cross-sectional views of (a) of FIG. 18 through (c) of FIG. 18, and (a) of FIG. 17 and (b) of FIG. 17 correspond to the respective cross-sectional views of (a) of FIG. 19 and (b) of FIG. 19. Conventionally, two types of insulated gate transistors, i.e., an etch-stop insulated gate transistor and a channel-etch insulated gate transistor are mostly used. The following discusses a case where a channel-etch insulated gate transistor is used as an example.

First, a first metal layer (metal layer for scanning signal line) having a thickness of approximately 0.1 μm to 0.3 μm is deposited on a main surface of a glass substrate 2 (e.g., product name: 1737 manufactured by Corning Incorporated) with the use of a vacuum film-depositing device such as an SPT (sputtering device) (see (a) of FIG. 16 and (a) of FIG. 18). Note that the glass substrate 2 is an insulating substrate having high heat resistance, high chemical resistance, and high transparency, and has a thickness of approximately 0.5 mm to 1.1 mm. Then, a scanning signal line 11, which serves also as a gate electrode 11A, and a storage capacitor line 16 are selectively deposited by a microfabrication technique. The scanning signal line is made up of a material which is selected by comprehensively considering heat resistance, chemical resistance, hydrofluoric acid resistance, and electric conductivity. In general, the scanning signal line is made up of (i) a metal thin film layer made of a material such as Cr or Ta or (ii) an alloy thin film layer made of a material such as MoW, because such thin film layers have high heat resistance.

It is rational to use Al (aluminum) as a material for a scanning signal line in order to reduce resistance of the scanning signal line, in order to deal with an increase in screen size and an increase in definition of a liquid crystal panel. However, Al itself has low heat resistance. In general, therefore, Cr, Ta, Mo, or a silicide of these, which is the above described heat-resistant metal, is stacked on Al nowadays. That is, the scanning signal line 11 is generally made up of one or more metal layers.

Subsequently, three types of thin film layers are sequentially stacked all over the glass substrate 2 with the use of a PCVD (plasma chemical vacuum deposition) device. The three types of thin film layers encompass (i) a first silicon nitride (SiNx) layer 30 having a thickness of, for example, 0.3 μm, (ii) a first amorphous silicon (a-Si) layer 31 with a thickness of, for example, 0.2 μm, which hardly contains an impurity and serves as a channel of the insulated gate transistor, and (iii) a second amorphous silicon layer (n+a-Si) 33 with a thickness of, for example, 0.05 μm, which contains phosphorus as an impurity and serves as a source and a drain of the insulated gate transistor. Then, a source and drain wiring material is formed by sequentially depositing, for example, a Ti thin film layer 34, an Al thin film layer 35, and a Ti thin film layer 36 with the use of a vacuum film-depositing device such as an SPT. Note that the Ti thin film layer 34 is a heat-resistant metal layer having a thickness of approximately 0.1 μm, the Al thin film layer 35 is a low-resistance metal layer having a thickness of approximately 0.3 μm, and the Ti thin film layer 36 is a buffer metal layer having a thickness of approximately 0.1 μm.

Then, (i) a data signal line 12, which serves also as a source electrode of the insulated gate transistor, and (ii) a drain electrode 21 of the insulated gate transistor are selectively formed by a microfabrication technique. Note that the data signal line 12 is configured by stacking a heat-resistant metal layer 34A, a low-resistance metal layer 35A, and a buffer metal layer 36A so that these layers and the gate electrode 11A partially overlap each other. The drain electrode 21 is configured by stacking a heat-resistant metal layer 34B, a low-resistance metal layer 35B, and a buffer metal layer 36B so that these layers and the gate electrode 11A partially overlap each other. According to this selective pattern formation, photosensitive resin patterns 80A and 80B are formed so that a channel formation area 80B (shaded area in (b) of FIG. 16) between the source and the drain has a thickness of, for example, 1.5 μm and a source wiring formation area 80A (12) and a drain wiring formation area 80A (21) have a thickness of 3 μm, with the use of a halftone exposure technique (see (b)

of FIG. 16 and (b) of FIG. 18). This is an important characteristic of the rationalized four-mask process.

In general, a positive photosensitive resin is used in producing an active matrix substrate 71. Accordingly, the photosensitive resin patterns 80A and 80B can be formed with the use of a photomask which has a black area, a gray (halftone) area, and a white area. The black area corresponds to the source and drain wiring formation areas 80A in which a Cr thin film is provided. The gray area corresponds to the channel formation area 80B in which a Cr pattern of lines and spaces, which Cr pattern has a width of, for example, approximately 0.5 µm to 1.5 µm, is provided so as to reduce transmitting light through the photomask. The white area corresponds to the other area of the photomask in which the Cr thin film is eliminated. In the gray area, resolving power of an exposure device is deteriorated, and therefore the pattern of lines and spaces is not resolved. This allows light, which is emitted from a lamp light source toward the photomask, to half transmit. This makes it possible to form the photosensitive resin patterns 80A and 80B which have a concave cross section (see (b) of FIG. 18) formed in accordance with a residual film property of the positive photosensitive resin. Note that, instead of providing the slits, it is possible to configure the gray area with the use of a metal layer, e.g., a thin film of MoSi2, which has a thickness and a transmittance different from those of the Cr thin film.

While causing the photosensitive resin patterns 80A and 80B to serve as a mask, the gate insulating layer 30 is exposed by sequentially etching the Ti thin film layer 36, the Al thin film layer 35, the Ti thin film layer 34, the second amorphous silicon layer 33, and the first amorphous silicon layer 31 (see (b) of FIG. 16 and (b) of FIG. 18). After that, the thicknesses of the photosensitive resin patterns 80A and 80B are reduced by 1.5 µm or more with the use of an ashing means such as oxygen plasma. This causes the photosensitive resin pattern 80B to be eliminated and accordingly the Ti thin film layer 36 is exposed (not illustrated) in the channel formation area. In this manner, a photosensitive resin patterns 80C (12) and 80C (21), which have reduced thicknesses, are left only in the source and drain wiring formation areas (see (c) of FIG. 16 and (c) of FIG. 18).

While causing the photosensitive resin patterns 80C (12) and 80C (21) to serve as a mask, the Ti thin film layer 36 between the source and the drain lines (i.e., Ti thin film layer in the channel formation area), the Al thin film layer 35, the Ti thin film layer 34, the second amorphous silicon layer 33, and the first amorphous silicon layer 31 are sequentially etched again so that a first amorphous silicon layer (channel section) 31A having a thickness of approximately 0.05 µm to 0.1 µm is left. At this point, a source 33S and a drain 33D, which are made up of the second amorphous silicon layer, are separated from each other. The source line 12 and the drain line 21 are provided by (i) etching the metal layer and (ii) further etching the first amorphous silicon layer 31A so as to be left with a thickness of approximately 0.05 µm to 0.1 µm. Therefore, an insulated gate transistor produced by such a method is called a "channel-etch" insulated gate transistor.

Note that, in the oxygen plasma process, the photosensitive resin pattern 80A is converted into the photosensitive resin pattern 80C having the reduced thickness. It is therefore preferable to improve anisotropy in order to suppress a change in size of the pattern. Specifically, it is preferable to employ an oxygen plasma process such as of an RIE (Reactive Ion Etching), more preferably, an ICP (Inductive Coupled Plasma) or a TCP (Transfer Coupled Plasma) using a source of plasma with higher density.

Moreover, after the photosensitive resin patterns 80C (12) and 80C (21) are eliminated, a passivation insulating layer 37 as a transparent insulating layer is formed by depositing a second SiNx layer, which has a thickness of approximately 0.3 µm, all over the glass substrate 2. Then, an opening 62 is formed above the drain electrode 21, an opening 63 is provided above an area in which an electrode terminal of the scanning signal line 11 is to be provided, and an opening 64 is provided above an area in which an electrode terminal of the data signal line 12 is to be provided (see (a) of FIG. 17 and (a) of FIG. 19). Note that the areas, above which the openings 63 and 64 are provided, and an image display section do not overlap each other. Further, (i) the passivation insulating layer 37 and the gate insulating layer 30 are eliminated from the opening 63 so that a part 5 of the scanning signal line is exposed in the opening 63, (ii) the passivation insulating layer 37 is eliminated from the opening 62 so that a part of the drain electrode 21 is exposed, and (iii) the passivation insulating layer 37 is eliminated from the opening 64 so that a part 6 of the data signal line is exposed. Similarly, an opening 65 is formed above the storage capacitor line 16 so that the storage capacitor line 16 is partially exposed.

Lastly, for example, an ITO (Indium-Tin-Oxide) or IZO (Indium-Zinc-Oxide) or a mixed crystal of them is deposited as a transparent conductive layer having a thickness of approximately 0.1 µm to 0.2 µm, with the use of a vacuum film-depositing device such as an SPT. Then, a transparent conductive pixel electrode 22 is selectively provided so as to cover the passivation insulating layer 37 and the opening 62, with the use of a microfabrication technique (see (b) of FIG. 17 and (b) of FIG. 19). This is how the active matrix substrate 71 is produced. The storage capacitor 15 (see FIG. 14) is defined by the drain electrode 21 and the storage capacitor line 16 which two-dimensionally overlap each other via the gate insulating layer 30, the first amorphous silicon layer 31A, and the second amorphous silicon layer 33D (see (b) of FIG. 17 and (b) of FIG. 19). The storage capacitor 15 is also indicated by an area 50, which is shaded with diagonal lines, in (a) of FIG. 18. Moreover, an electrode terminal 5A is selectively formed above the passivation insulating layer 37 and the opening 63, and an electrode terminal 6A is selectively formed above the passivation insulating layer 37 and the opening 64.

In a case where the source line 12 and the drain line 21 are made of an Al material as described above, it is necessary to provided the heat-resistant metal layer 34 in order to secure an electrical connection between (i) the second amorphous silicon 33 and (ii) the source line 12 and the drain line 21. Moreover, it is necessary to provided the buffer metal layer 36 between (i) the transparent conductive layer and the (ii) the source line 12 and the drain line 21 in order to prevent a battery effect in an alkaline solution. Consequently, the source and drain lines are to be configured by a three-layered structure. Nevertheless, it is difficult to avoid using the low-resistance metal layer (Al thin film layer), in order address a severe restriction in terms of the resistance of the source and drain lines in a liquid crystal panel with a large screen and high definition.

Conventionally, in a case where the heat-resistant metal layer 34 and the buffer metal layer 36 are made of Ti, it is necessary to carry out a dry etching process with the use of chlorine gas. Accordingly, the Al is subjected to the dry etching process with the chlorine gas. This causes a burden in terms of material and production equipment. However, in these days, new chemicals for etching Ti have been provided by Mitsubishi Chemical Corporation. This has improved a possibility to reduce burden of investment in the production equipment. In a case where the heat-resistant metal layer 34 and the buffer metal layer 36 are made of Mo instead of Ti, a three-layered configuration of Mo/Al/Mo is usually subjected to a chemical treatment once with the use of a phosphate solution to which an appropriate amount of nitric acid is added. It is therefore easily understandable that cost of investment in the production equipment can be suppressed. Moreover, it is self-explanatory that various efforts have been made in order to reduce production cost by simplifying the source and drain lines as much as possible.

CITATION LIST

Patent Literatures

[Patent Literature 1]
Japanese Patent No. 2987045 (Publication Date: Jul. 28, 1995)
[Patent Literature 2]
Japanese Patent Application Publication, Tokukai, No. 2000-206571 (Publication Date: Jul. 28, 2000)

SUMMARY OF INVENTION

Technical Problem

Electrostatic capacitors Cgs and Cgd are defined by (i) the scanning signal line 11 and (ii) the source and drain lines 12 (having the second amorphous silicon layers 33S and 33D) between which (i) and (ii) the gate insulating layer 30 and the first amorphous silicon layer 31A are provided. The electrostatic capacitors Cgs and Cgd are parasitic capacitors, unlike the storage capacitor 15 (see FIG. 14) which drives liquid crystal cells.

The electrostatic capacitor Cgs serves as a load on drivers of the scanning signal line and the data signal line, and thereby drastically affects power consumption of the liquid crystal panel. Further, the electrostatic capacitor Cgs causes wiring low resistance and delays of signal waveforms in the scanning signal line 11 and the data signal line 12. The electrostatic capacitor Cgs is, therefore, an important factor in considering a time constant in a large and high-definition screen.

The electrostatic capacitor Cgd causes a drain electrode to be shifted toward negative in response to a falling edge of a scanning signal. Accordingly, DC element is applied to the liquid crystal cells, and thereby a flicker occurs. It is not so difficult to prevent the flicker from occurring by adjusting and an electric potential of the counter electrode 14 so as to minimize the electric potential. However, it is a necessary design technique to suppress a time constant in order to secure a high image quality encompassing uniformity in a liquid crystal panel having a large screen. Therefore, the scanning signal line is made of a thick material nowadays. Moreover, in order to further reduce resistance, Cu is increasingly being used as a wiring material instead of Al.

In order to make a time constant small, it is important to reduce wiring resistance and parasitic capacitor of the transistor. However, the patterning design technique, which optimizes widths and arrangements in patterning scanning signal lines and source and drain lines, is approaching its limit due to restrictions of an existing exposure system and a photosensitive material. Therefore, in a case where a parasitic capacitor is to be further reduced in a conventional transistor, deterioration in characteristics of the transistor may occur.

The present invention is accomplished in view of the circumstances, and its object is to provide (i) an insulated gate transistor which can reduce parasitic capacitor without deteriorating characteristics of the transistor and (ii) a method for producing the insulated gate transistor.

Solution to Problem

In order to attain the object, an insulated gate transistor of the present invention with a gate electrode, a source electrode, and a drain electrode, includes: a transparent insulating substrate; and an insulating layer, the gate electrode being provided on a main surface of the transparent insulating substrate, and a first part of the insulating layer being thicker than a second part of the insulating layer, the first part being between the gate electrode and respective of the source electrode and the drain electrode, and the second part being between the gate electrode and a channel section of the insulated gate transistor.

Moreover, an active matrix substrate of the present invention includes: a data signal line; a scanning signal line; an insulated gate transistor, which has a gate electrode, a source electrode, and a drain electrode and which is connected with the data signal line and the scanning signal line; and a pixel electrode which is connected with the data signal line via the insulated gate transistor, a first part of an insulating layer being thicker than a second part of the insulating layer, the first part being between the gate electrode and respective of the source electrode and the drain electrode, and the second part being between the gate electrode and a channel section of the insulated gate transistor.

Moreover, a liquid crystal display device of the present invention includes: a first transparent insulating substrate having a main surface on which unit pixels are two-dimensionally provided in a matrix manner, each of the unit pixels including (i) an insulated gate transistor, which is a channel-etch insulated gate transistor with a gate electrode, a source electrode, and a drain electrode, (ii) a scanning signal line serving also as the gate electrode, (iii) a data signal line serving also as the source electrode, and (iv) a pixel electrode which is connected with a drain line serving also as the drain electrode; a second transparent insulating substrate or a color filter which faces the first transparent insulating substrate; and liquid crystal provided between the first transparent insulating substrate and the second transparent insulating substrate or the color filter, the scanning signal line being made up of at least one metal layer provided on the main surface of the first transparent insulating substrate, and a first part of an insulating layer being thicker than a second part of the insulating layer, the first part being between the gate electrode and respective of the source electrode and the drain electrode, and the second part being between the gate electrode and a channel section of the insulated gate transistor.

According to the configurations, it is possible to cause a distance between (i) the gate electrode and (ii) the source and drain electrodes to be larger than that between the gate electrode and the channel section. Specifically, for example, the source and drain electrodes and the gate electrode overlap each other via the gate insulating layer and the transparent inorganic insulating layer. It is therefore possible to cause the distance between (i) the gate electrode and (ii) the source and drain electrodes to be larger than a conventional configuration in which only a gate insulating layer is provided between (i) a gate electrode and (ii) source and drain electrodes. This makes it possible to reduce (i) a parasitic capacitor between the gate and the source and (ii) a parasitic capacitor between the gate and the drain. Moreover, the channel section and the gate electrode overlap each other via only the gate insulating layer, as with the conventional configuration. Therefore, characteristics of the transistor are not deteriorated.

As described above, a film thickness between (i) the gate electrode and (ii) the source and drain electrodes can be increased while the film thickness between the gate electrode and the channel section is maintained at the same level as the conventional configuration. This makes it possible to reduce parasitic capacitors without deteriorating characteristics of the transistor, as compared to the conventional configuration.

In order to attain the object, a method for producing an insulated gate transistor of the present invention includes the steps of: (a) forming at least one metal layer on a main surface of a transparent insulating substrate; (b) forming a photosensitive resin pattern on the at least one metal layer so that the photosensitive resin pattern has a thickness which is thicker in an area corresponding to a gate electrode than in an area corresponding to source and drain formation areas; (c) selectively forming a gate electrode pattern, made up of the at least one metal layer, with use of the photosensitive resin pattern; (d) exposing the at least one metal layer in the source and drain formation areas above respective edge parts of the gate electrode, by reducing a thickness of the photosensitive resin pattern; (e) fluorinating a surface of the photosensitive resin pattern, whose thickness has been reduced, by dry etching with fluorine gas; (f) applying transparent inorganic insulating resin onto the surface which has been fluorinated in the step (e); (g) removing the photosensitive resin pattern, which has been fluorinated; (h) forming at least a gate insulating layer and a semiconductor layer; and (i) forming source and drain lines so that (a) the source and drain lines and (b) the source and drain formation areas, respectively, overlap each other.

Moreover, a method for producing an active matrix substrate of the present invention is a method for producing an active matrix substrate in which a transparent insulating substrate having a main surface on which unit pixels are two-dimensionally provided in a matrix manner, each of the unit pixels including (i) an insulated gate transistor, which is a channel-etch insulated gate transistor with a gate electrode, a source electrode, and a drain electrode, (ii) a scanning signal line serving also as the gate electrode, (iii) a data signal line serving also as the source electrode, and (iv) a pixel electrode which is connected with a drain line serving also as the drain electrode, the method including the steps of: (a) forming at least one metal layer on a main surface of a transparent insulating substrate; (b) forming a photosensitive resin pattern on the at least one metal layer so that the photosensitive resin pattern has a thickness which is thicker in an area corresponding to the gate electrode than in an area corresponding to source and drain formation areas; (c) selectively forming a gate electrode pattern, made up of the at least one metal layer, with use of the photosensitive resin pattern; (d) exposing the at least one metal layer in the source and drain formation areas above respective edge parts of the gate electrode, by reducing a thickness of the photosensitive resin pattern; (e) fluorinating a surface of the photosensitive resin pattern, whose thickness has been reduced, by dry etching with fluorine gas; (f) applying transparent inorganic insulating resin onto the surface which has been fluorinated in the step (e); (g) removing the photosensitive resin pattern, which has been fluorinated; (h) forming at least a gate insulating layer and a semiconductor layer; (i) forming source and drain lines so that (a) the source and drain lines and (b) the source and drain formation areas, respectively, overlap each other; (j) forming a passivation insulating layer after the step (i); (k) forming an opening in the passivation insulating layer, the opening being provided partially above the drain electrode; and (l) forming a transparent conductive layer, serving as a pixel electrode, on the passivation insulating layer and in the opening.

Moreover, a method for producing a liquid crystal display device of the present invention is a method for producing a liquid crystal display device which includes: an active matrix substrate having a main surface on which unit pixels are two-dimensionally provided in a matrix manner, each of the unit pixels including (i) an insulated gate transistor, which is a channel-etch insulated gate transistor with a gate electrode, a source electrode, and a drain electrode, (ii) a scanning signal line serving also as the gate electrode, (iii) a data signal line serving also as the source electrode, and (iv) a pixel electrode which is connected with a drain line serving also as the drain electrode; a counter substrate or a color filter which faces the first transparent insulating substrate; and liquid crystal provided between the active matrix substrate and the counter substrate insulating substrate or the color filter, the method including the steps of: (a) forming at least one metal layer on a main surface of a transparent insulating substrate included in the active matrix substrate; (b) forming a photosensitive resin pattern on the at least one metal layer so that the photosensitive resin pattern has a thickness which is thicker in an area corresponding to the gate electrode than in an area corresponding to source and drain formation areas; (c) selectively forming a gate electrode pattern, made up of the at least one metal layer, with use of the photosensitive resin pattern; (d) exposing the at least one metal layer in the source and drain formation areas above respective edge parts of the gate electrode, by reducing a thickness of the photosensitive resin pattern; (e) fluorinating a surface of the photosensitive resin pattern, whose thickness has been reduced, by dry etching with fluorine gas; (f) applying transparent inorganic insulating resin onto the surface which has been fluorinated in the step (e); (g) removing the photosensitive resin pattern, which has been fluorinated; (h) forming at least a gate insulating layer and a semiconductor layer; (i) forming source and drain lines so that (a) the source and drain lines and (b) the source and drain formation areas, respectively, overlap each other; (j) forming a passivation insulating layer after the step (i); (k) forming an opening in the passivation insulating layer, the opening being provided partially above the drain electrode; and (l) forming a transparent conductive layer, serving as a pixel electrode, on the passivation insulating layer and in the opening.

According to the method, the metal layer in the source and drain formation areas, which are located above the respective edge parts of the gate electrode, is exposed in accordance with the photosensitive resin pattern, which is fluorinated so as to have water repellency. Accordingly, transparent insulating resin applied to the glass substrate is repelled by the photosensitive resin pattern, and therefore the transparent insulating resin is to be applied, in a self-aligning manner, to the area in which the photosensitive resin pattern is not provided.

Then, the gate insulating film and the source and drain lines are provided so that (i) the source and drain lines and the gate electrode overlap each other via the gate insulating layer and the transparent inorganic insulating layer and (ii) the channel section and the gate electrode overlap each other via only the gate insulating layer.

This makes it possible to increase a film thickness between (i) the source and drain electrodes and (ii) the gate electrode while the film thickness between the channel section and the gate electrode is maintained at the same level as the conventional configuration. It is therefore possible to produce the transistor which can reduce parasitic capacitors without deteriorating characteristics of the transistor, as compared to the conventional configuration.

Moreover, according to the method, it is possible to produce the insulated gate transistor of the present invention without increasing the number of the manufacturing processes.

Advantageous Effects of Invention

As described above, the insulated gate transistor of the present invention with a gate electrode, a source electrode, and a drain electrode, includes: a transparent insulating substrate; and an insulating layer, the gate electrode being provided on a main surface of the transparent insulating substrate, and a first part of the insulating layer being thicker than a second part of the insulating layer, the first part being between the gate electrode and respective of the source electrode and the drain electrode, and the second part being between the gate electrode and a channel section of the insulated gate transistor.

Moreover, the method for producing the insulated gate transistor of the present invention includes the steps of: (c) selectively forming a gate electrode pattern, made up of the at least one metal layer, with use of the photosensitive resin pattern; (d) exposing the at least one metal layer in the source and drain formation areas above respective edge parts of the gate electrode, by reducing a thickness of the photosensitive resin pattern; (e) fluorinating a surface of the photosensitive resin pattern, whose thickness has been reduced, by dry etching with fluorine gas; (f) applying transparent inorganic insulating resin onto the surface which has been fluorinated in the step (e).

According to the configuration, it is possible to increase the film thickness between (i) the gate electrode and (ii) the source and drain electrodes while the film thickness between the channel section and the gate electrode is maintained at the same level as the conventional configuration.

Moreover, according to the insulated gate transistor and the method for producing the insulated gate transistor, it is possible to reduce parasitic capacitors without deteriorating characteristics of the transistor.

BRIEF DESCRIPTION OF DRAWINGS

FIG. 6 successively illustrates the production process shown in FIG. 5.

FIG. 10 successively illustrates the production process shown in FIG. 9.

FIG. 16 is a plain view illustrating a production process of the conventional active matrix substrate.

FIG. 17 successively illustrates the production process shown in FIG. 16.

DESCRIPTION OF EMBODIMENTS

The following describes an embodiment of the present invention with reference to FIGS. 1 through 12.

Figure 1:
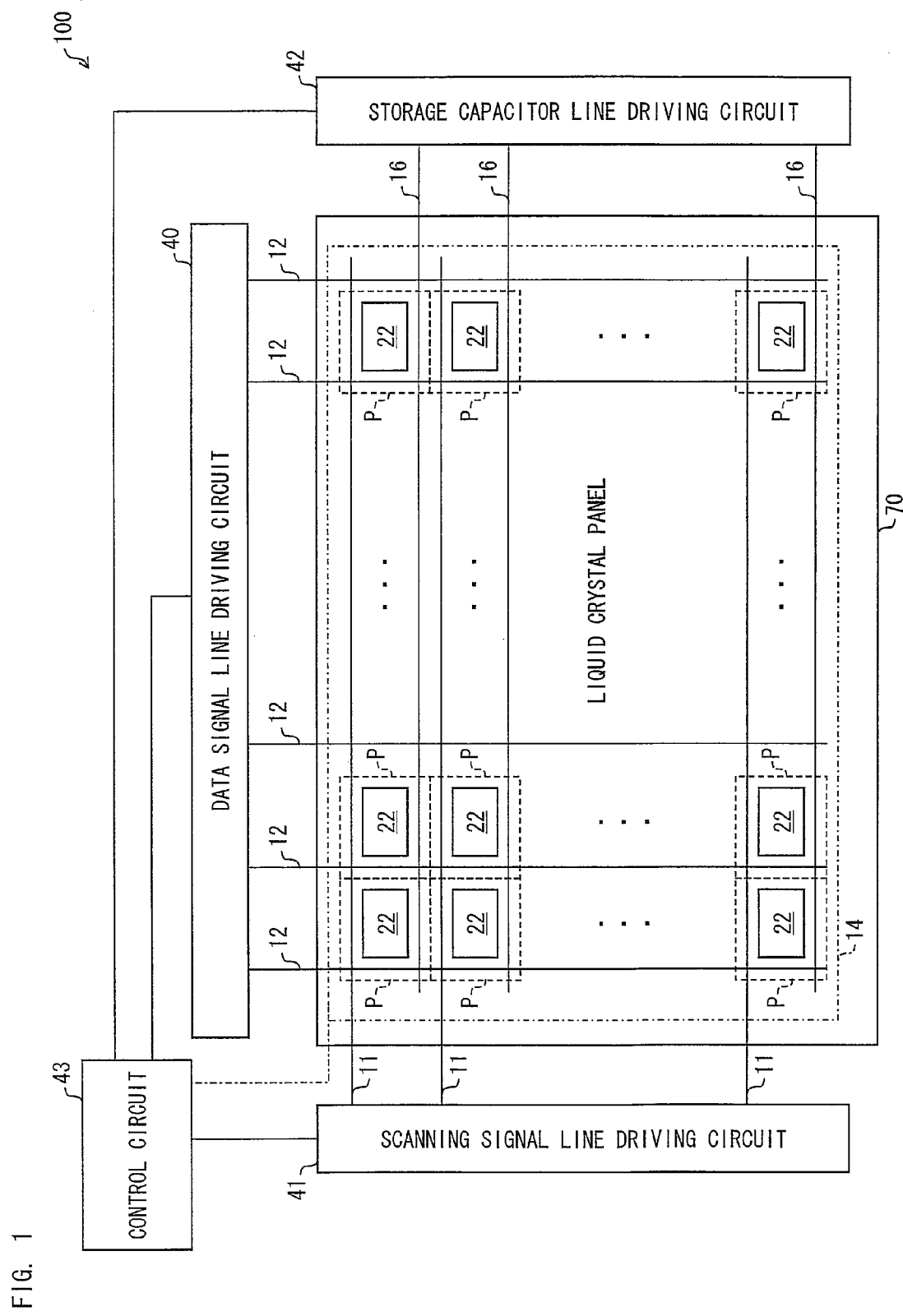
FIG. 1 is a plain view illustrating a whole configuration of a liquid crystal display device of the present invention.
Figure 2:
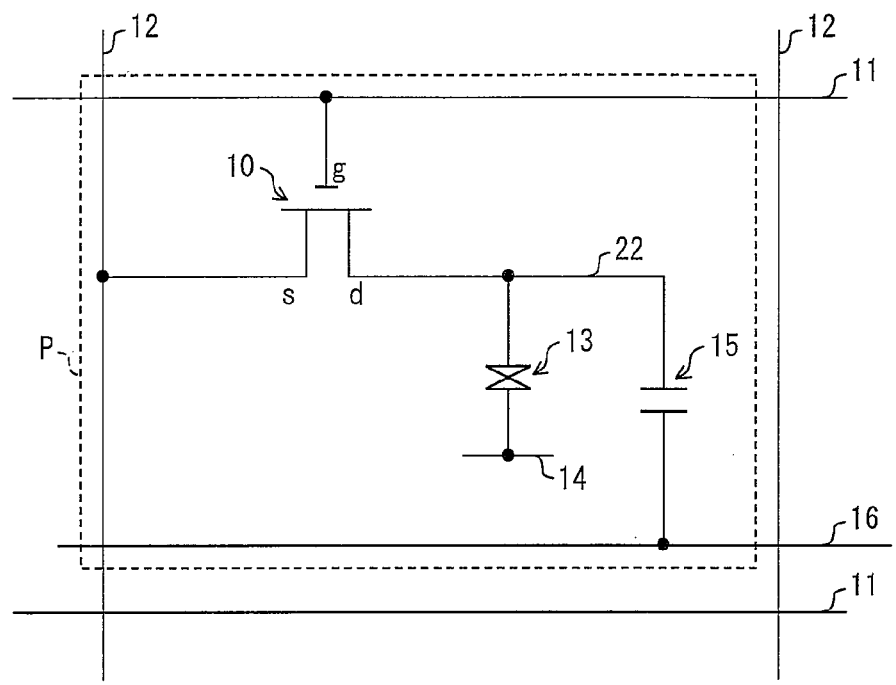
FIG. 2 is an equivalent circuit diagram illustrating an electrical configuration of a pixel in the liquid crystal display device.

First, the following describes a whole configuration of a liquid crystal display device 100 of the present embodiment with reference to FIGS. 1 and 2. Note that FIG. 1 is a plain view illustrating the whole configuration of the liquid crystal display device 100 and FIG. 2 is an equivalent circuit diagram illustrating an electrical configuration of each pixel in the liquid crystal display device 100.

The liquid crystal display device 100 includes an active matrix liquid crystal panel 70, a data signal line driving circuit 40, a scanning signal line driving circuit 41, a storage capacitor line driving circuit 42, and a control circuit 43.

The liquid crystal panel 70 is configured so that liquid crystal is sandwiched between an active matrix substrate (later described) and a counter substrate (color filter substrate). The liquid crystal panel 70 has a number of pixels P which are provided in a matrix manner.

Moreover, according to the liquid crystal panel 70, there are provided, on the active matrix substrate, scanning signal lines (gate lines) 11, data signal lines (source lines) 12, insulated gate transistors (hereinafter, referred to as "transistors") 10, pixel electrodes 22, and storage capacitor lines 16, and there is provided, on the color filter substrate, (ii) a counter electrode 14 is provided. Note that the transistor 10 is illustrated only in FIG. 2, but is not illustrated in FIG. 1.

The data signal lines 12 are provided in respective columns so as to be in parallel with each other in a column direction (vertical direction). The scanning signal lines 11 are provided in respective rows and extend in a row direction (horizontal direction) so as to be in parallel with each other. The transistors 10 are provided at respective intersections of the data signal lines 12 and the scanning signal lines 11. Similarly, the pixel electrodes 22 are provided at respective intersections of the data signal lines 12 and the scanning signal lines 11. Each of the transistors 10 has (i) a source electrode s which is connected with a corresponding one of the data signal lines 12, (ii) a gate electrode g which is connected with a corresponding one of the scanning signal lines 11, and (iii) a drain electrode d which is connected to a corresponding one of the pixel electrodes 22. Moreover, each liquid crystal capacitor is defined by the corresponding one of the pixel electrodes 22 and the counter electrode 14 between which liquid crystal 13 is provided.

With the configuration, a gate signal (scanning signal), which is supplied to a scanning signal line 11, causes a gate of a corresponding one of the transistors 10 to turn on. A source signal (data signal) is written into a pixel electrode 22 from a corresponding one of the data signal lines 12, so that an electric potential of the pixel electrode 22 is set based on the source signal. This causes a voltage which varies depending on the source signal to be applied to the liquid crystal, provided between the pixel electrode 22 and the counter electrode 14, so that a tone display can be carried out based on the source signal.

The storage capacitor lines 16 are provided on the respective rows and extend in the row direction (horizontal direction) so as to be (i) in parallel with each other and (ii) paired with the respective scanning signal lines 11. Each of the storage capacitor lines 16 is capacity-coupled with a pixel electrode 22, which is provided in a corresponding row, and therefore a storage capacitor (auxiliary capacitor) 15 is defined by the respective storage capacitor lines 16 and the respective pixel electrodes 22.

The liquid crystal panel 70 thus configured is driven by the data signal line driving circuit 40, the scanning signal line driving circuit 41, the storage capacitor line driving circuit 42, and the control circuit 43 which controls the circuits 40, 41, and 42.

According to the present embodiment, horizontal scanning periods during which the respective rows are scanned are successively assigned in respective active periods (effective scanning periods) of vertical scanning periods, which are periodically repeated.

Accordingly, the scanning signal line driving circuit 41 sequentially supplies gate signals, each of which causes the transistors 10 to turn on, to the scanning signal lines 11 in respective rows in sync with respective horizontal scanning periods.

Moreover, the data signal line driving circuit 40 supplies source signals to the respective data signal lines 12. The source signals are generated by the data signal line driving circuit 40 which (i) receives, via the control circuit 43, video signals from outside of the liquid crystal display device 100, (ii) assigns the video signals to the respective columns, and then (iii) carries out processes such as stepping up of the respective voltages.

The storage capacitor line driving circuit 42 supplies CS signals to the respective storage capacitor lines 16. Each of the CS signals, for example, has an electric potential which is changed between two values (rises or falls). Specifically, an electric potential of each of the CS signals of a corresponding one of the storage capacitor lines 16 is changed from one of the two values to the other, in sync with an end of a horizontal scanning period (1H) of a corresponding one of the rows, i.e., in sync with the transistors 10 of a corresponding one of the rows being changed from turning ON to OFF.

The control circuit 43 controls the scanning signal line driving circuit 41, the data signal line driving circuit 40, and the storage capacitor line driving circuit 42 so as to cause the circuits 41, 40, and 42 to output a gate signal, a source signal, and a CS signal, respectively.

Figure 3:
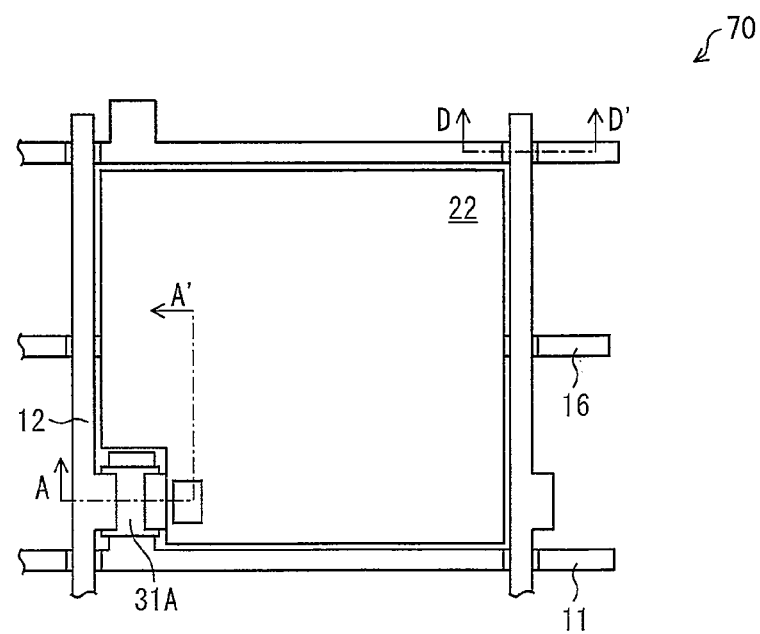
FIG. 3 is a plain view illustrating a configuration of a pixel in a liquid crystal panel of the present embodiment.
Figure 4:
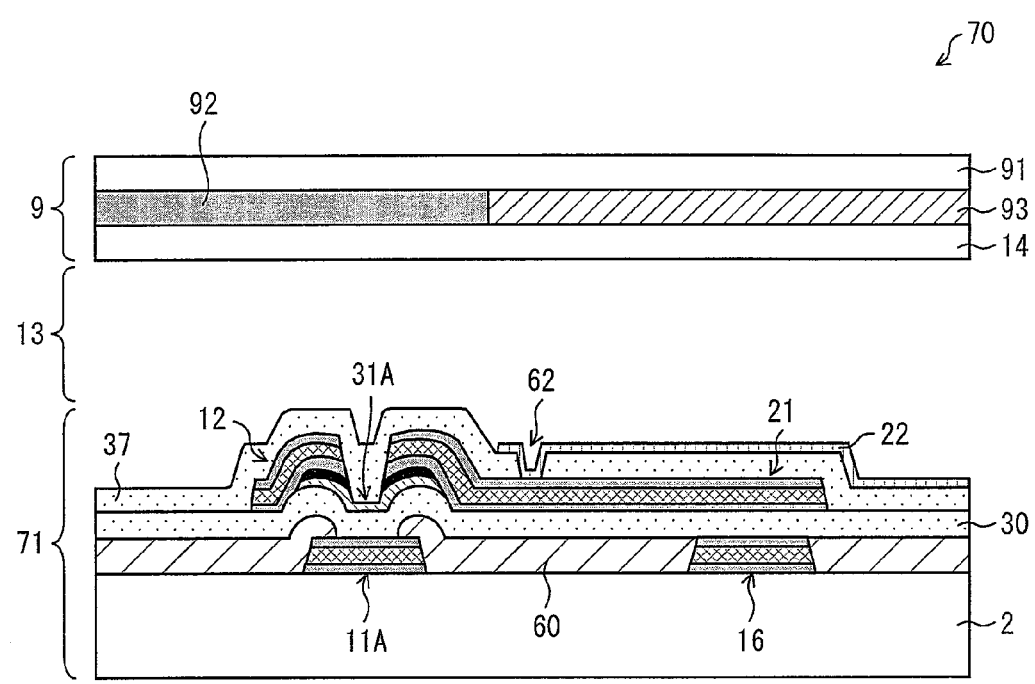
FIG. 4 is a cross-sectional view taken along the line A-A' of FIG. 3.

FIG. 3 is a plain view illustrating a configuration of each pixel in the liquid crystal panel 70 of the present embodiment. FIG. 4 is a cross-sectional view taken along the line A-A' of FIG. 3. The liquid crystal panel 70 includes (i) an active matrix substrate (first transparent insulating substrate, semiconductor device for display device) 71, (ii) a color filter substrate (second transparent insulating substrate) 9 which faces the active matrix substrate 71, and (iii) a liquid crystal layer 13 which is provided between both the substrates (71 and 9) (see FIG. 4). Note that FIG. 4 illustrates, as an example of the transistor, a channel-etch transistor.

The active matrix substrate 71 includes a glass substrate (transparent insulating substrate) 2 on which a scanning signal line 11 (gate electrode 11A), a storage capacitor line 16, and a transparent inorganic insulating resin (insulating layer) 60 are provided. Note that the transparent inorganic insulating resin 60 has (i) a first hollow where the transparent inorganic insulating resin 60 and the storage capacitor line 16 overlap each other and (ii) a second hollow where the transparent inorganic insulating resin 60 and the scanning signal line (gate electrode 11A) overlap each other. A gate insulating layer (insulating layer) is provided so as to cover the transparent inorganic insulating resin 60 and the first and second hollows. A semiconductor layer, a source electrode 12, and a drain electrode (drain line) 21 are provided on the gate insulating layer 30, and an interlayer insulating film 37 is further provided so as to cover the semiconductor layer, the source electrode 12, and the drain electrode (drain line) 21. Note that (i) the semiconductor layer (a channel section 31A of the transistor) and the source electrode 12 and the drain electrode 21 do not overlap each other and (ii) a part of the semiconductor layer is partially eliminated by a process such as etching. A pixel electrode 22 is provided on the interlayer insulating film 37, and an alignment film (not illustrated) is further provided so as to cover the pixel electrode 22. The interlayer insulating film 37 is hollowed in a region where a contact hole (opening) 62 is secured. The contact hole 62 causes the pixel electrode 22 to be connected to the drain electrode 21.

On the other hand, the color filter substrate 9 includes a glass substrate (transparent insulating substrate) 91 on which a black matrix 92 and a colored layer (color filter) 93 are provided. Moreover, (i) a counter electrode (com) 14 is provided on the black matrix 92 and the colored layer 93, and (ii) an alignment film (not illustrated) is provided so as to cover the counter electrode 14.

According to the active matrix substrate 71 of the liquid crystal panel 70 thus configured, (i) the gate electrode 11A (scanning signal line 11), which is made up of at least one metal layer, is provided on the glass substrate 2 serving as the transparent insulating substrate and (ii) the transparent inorganic insulating resin 60 is provided on the glass substrate 2, on which the gate electrode 11A has been provided, (a) so as to cover a first area, in which the first area and each of the source electrode 12 and the drain electrode 21 (source line 12 and drain line 21) overlap each other, above the gate electrode 11A but (b) so as not to cover a second area, in which the second area and the channel section 31A overlap each other, above the gate electrode 11A. Moreover, the gate insulating layer 30 is provided so as to cover the transparent inorganic insulating resin 60 and the second area.

This allows the channel section 31A of the transistor and the gate electrode 11A to overlap each other via only the gate insulating layer 30, whereas allows (i) each of the source line (source electrode) 12 and the drain line (drain electrode) 21 and (ii) the gate electrode 11A to overlap each other via the gate insulating layer 30 and the transparent inorganic insulating resin 60. That is, a distance between (i) the gate electrode 11A and (ii) respective of the source electrode 12 and drain electrode 21 becomes larger than a distance between the gate electrode 11A and the channel section 31A.

This makes it possible to increase a distance (i.e., a thickness of the insulating layer) between (i) the gate electrode 11A and (ii) respective of the source line 12 and drain line 21, without increasing a thickness of the insulating layer in the channel area. Accordingly, it is possible to reduce parasitic capacitors while maintaining characteristics of the transistor. It is also possible to further reduce power consumption.

Note that at least of the gate insulating layer 30 and the transparent inorganic insulating resin 60 should be provided between (i) the gate electrode 11A and (ii) respective of the source line 12 and drain line 21. It is therefore possible to further provide another insulating layer between them. Such another insulating layer can be, for example, made of $TaO_2$ or $Al_2O_3$ prepared by anodizing a surface of a gate electrode made of Ta or Al.

The following describes a method for producing an active matrix substrate 71 which has the characteristics described above. Note that (i) Embodiment 1 below describes a method for producing an active matrix substrate, which includes a channel-etch transistor, with the use of a five-mask process and (ii) Embodiment 2 describes a method for producing an active matrix substrate, which includes an etch-stop transistor, with the use of a five-mask process.

Embodiment 1

Figure 5:
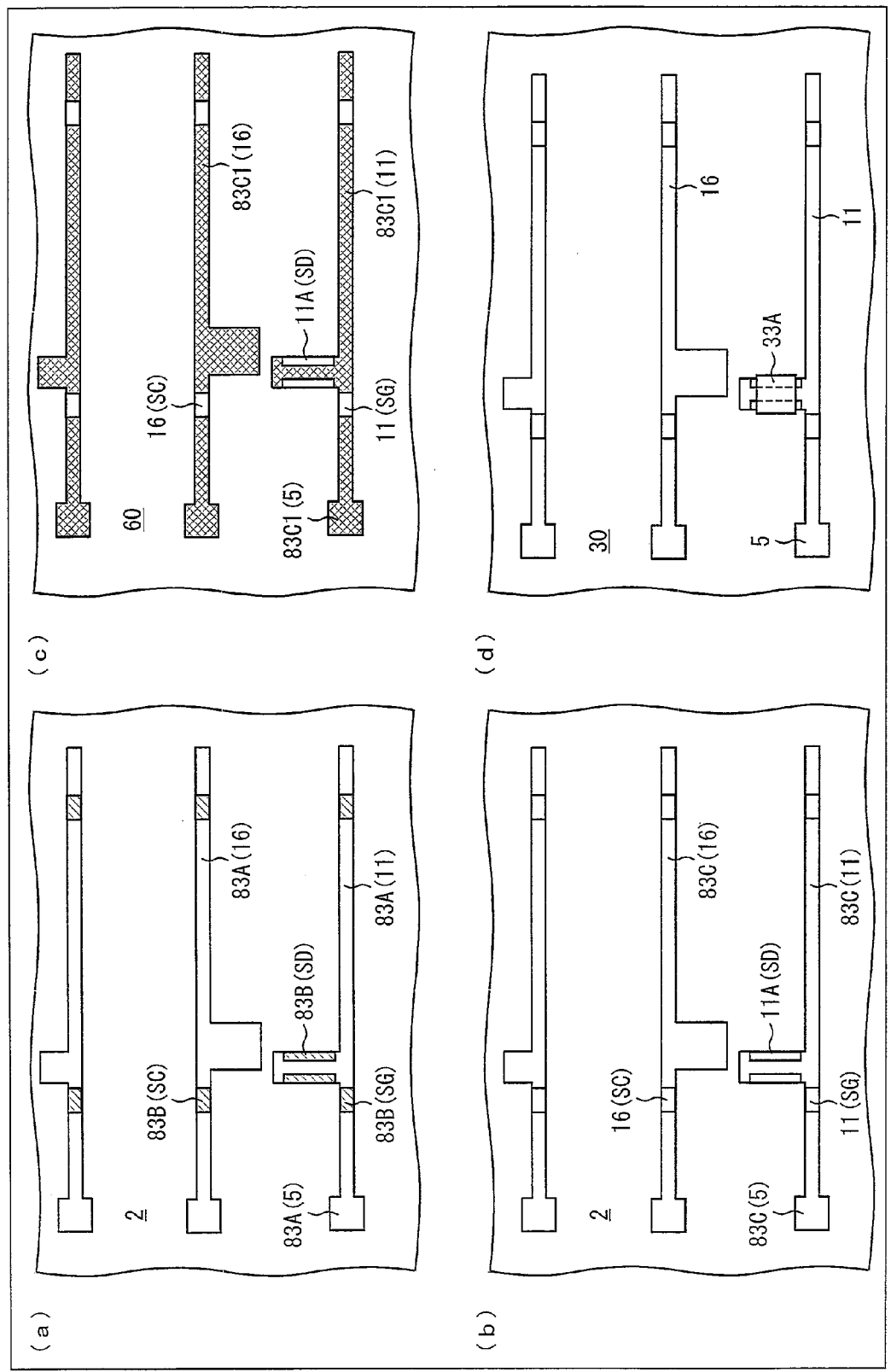
FIG. 5 is a plain view illustrating a production process of an active matrix substrate of Embodiment 1.
Figure 6:
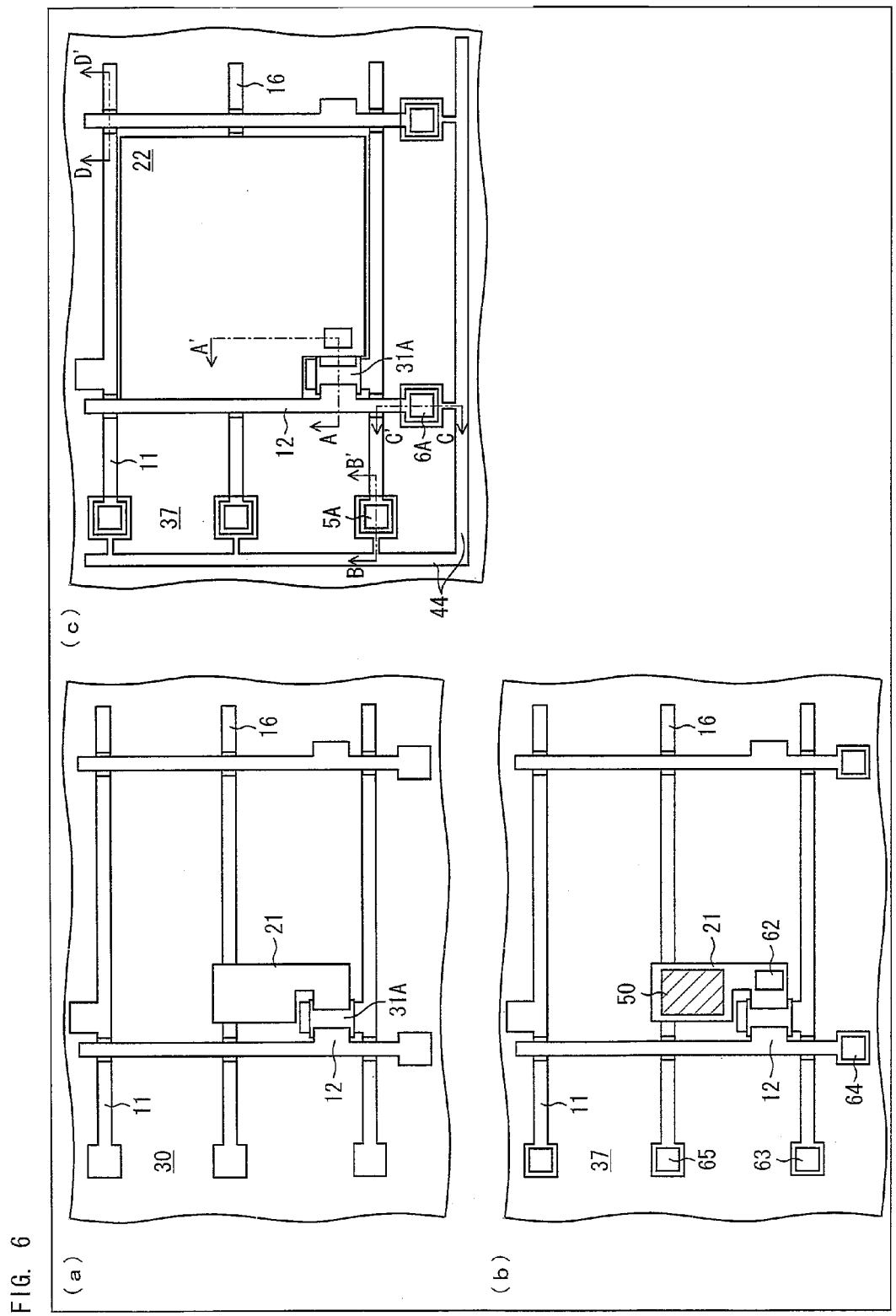
FIG. 6 is a plain view illustrating the production process of the active matrix substrate of Embodiment 1.
Figure 7:
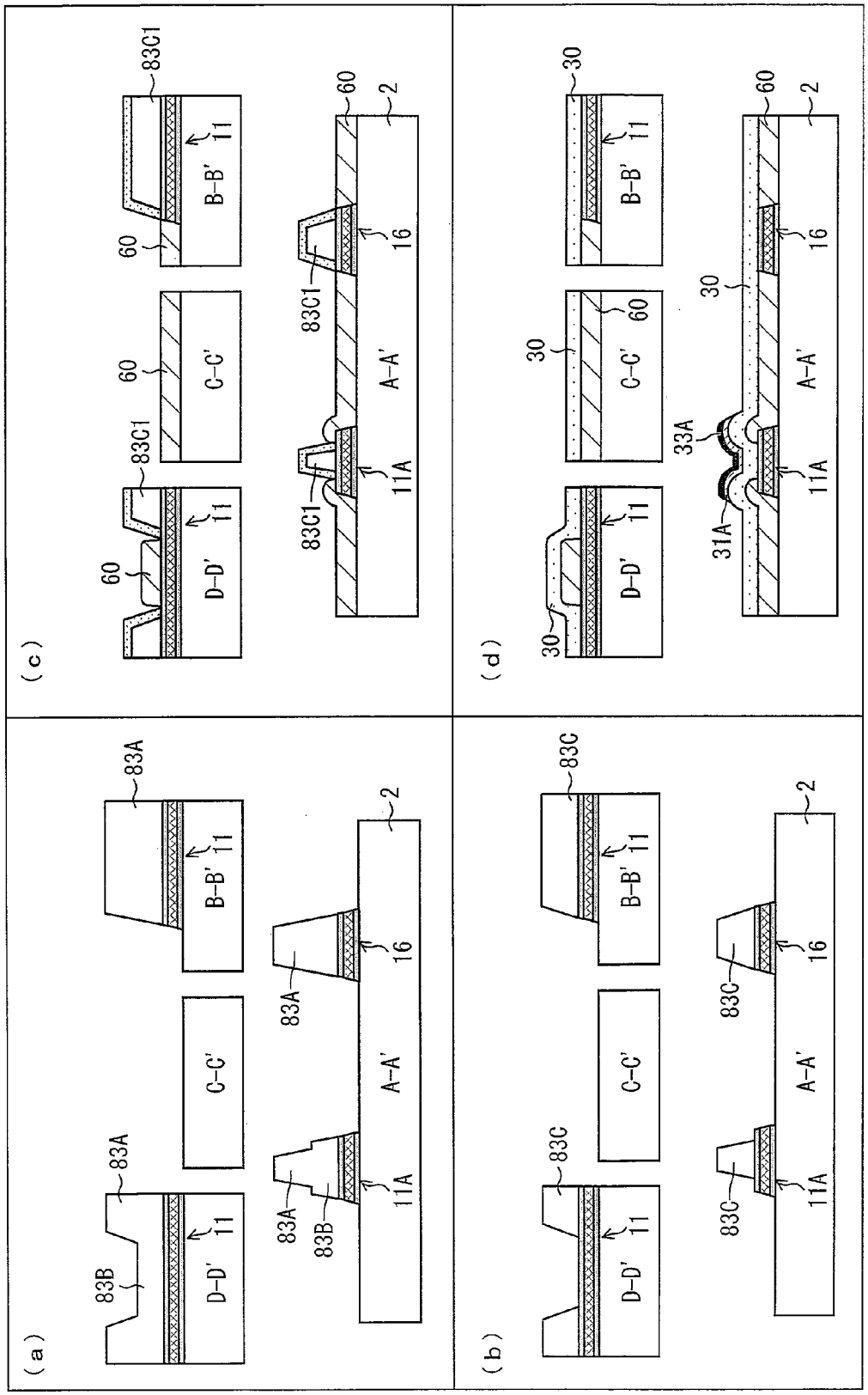
FIG. 7 is a cross-sectional view illustrating the production process of the active matrix substrate shown in FIG. 5, in which (a) through (d) of FIG. 7 correspond to (a) through (d) of FIG. 5, respectively.
Figure 8:
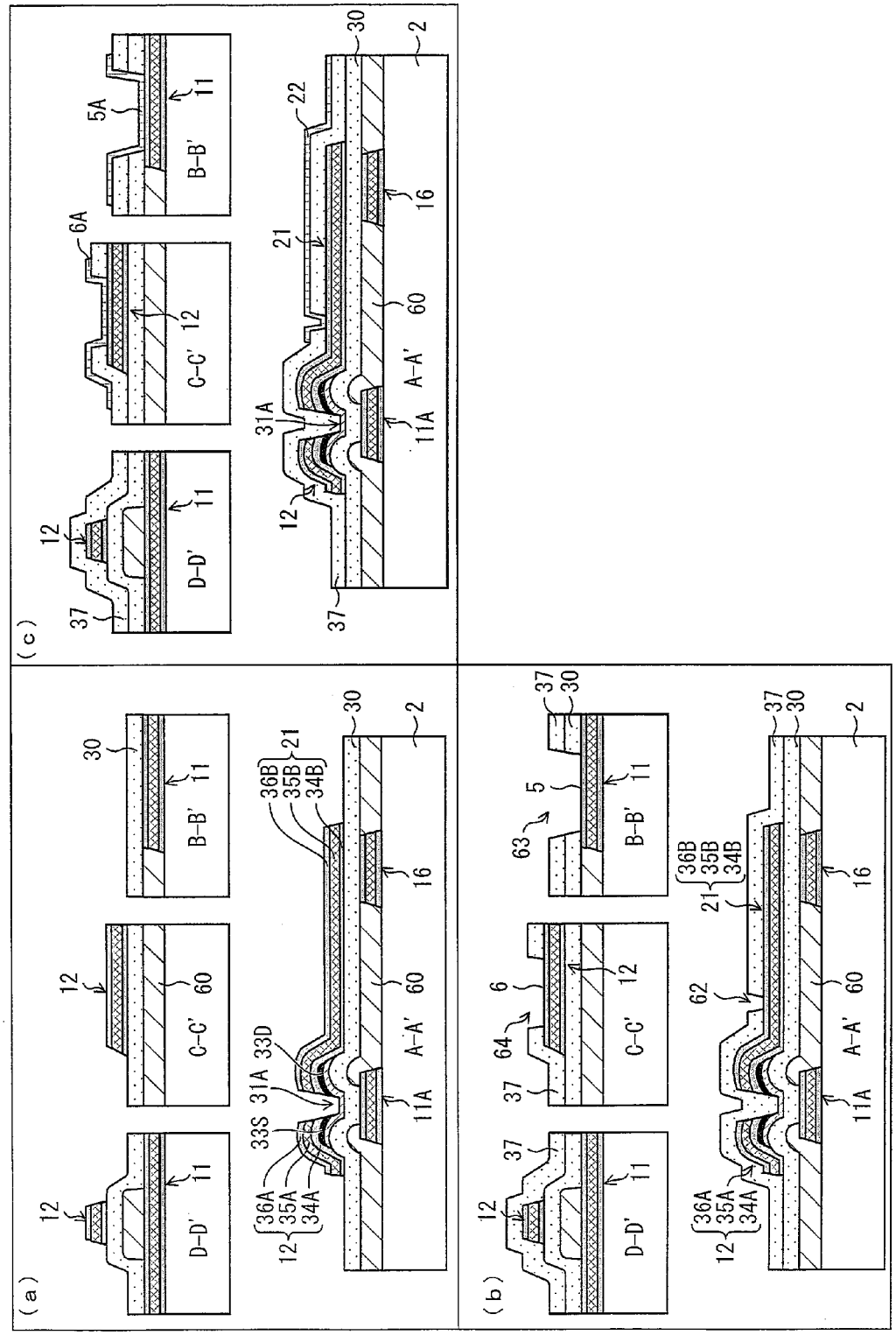
FIG. 8 is a cross-sectional view illustrating the production process of the active matrix substrate shown in FIG. 6, in which (a) through (c) of FIG. 8 correspond to (a) through (c) of FIG. 6, respectively.

FIGS. 5 and 6 are plain views which illustrate processes for producing an active matrix substrate (semiconductor device for display device) 71 of Embodiment 1. FIGS. 7 and 8 are cross-sectional views illustrating the active matrix substrate 71 shown in FIGS. 5 and 6. In FIGS. 7 and 8, an A-A' cross section shows a transistor area, a B-B' cross section shows an electrode terminal area of a scanning signal line 11, a C-C' cross section shows an electrode terminal area of a data signal line 12, and a D-D' cross section shows a cross section of the scanning signal line 11. Note that the lines (A-A', B-B', C-C', and D-D') correspond to those in (c) of FIG. 6. Moreover, plain views of (a) through (d) of FIG. 5 correspond to respective cross-sectional views of (a) through (d) of FIG. 7. Moreover, plain views of (a) through (c) of FIG. 6 correspond to respective cross-sectional views of (a) through (c) of FIG. 8.

First, a first metal layer (metal layer for scanning signal line) having a thickness of approximately 0.1 μm to 0.3 μm is deposited on a main surface of a glass substrate 2 with the use of a vacuum film-depositing device such as an SPT. In this embodiment, a stacking layer configuration such as Ti/Al/Ti or Mo/Al/Mo is employed as the first metal layer. Then, photosensitive resin patterns 83A and 83B are provided on the first metal layer with the use of a halftone exposure technique. The photosensitive resin pattern 83A (i) corresponds to the scanning signal line 11 and the storage capacitor line 16 and (ii) has a thickness of, for example, 2 μm. The photosensitive resin pattern 83B has a thickness of, for example, 1 μm and corresponds to (i) source and drain formation areas (SD) in both ends of the gate electrode 11A, (ii) the vicinity (SG) of an intersection of the scanning signal line 11 and the data signal line 12, and (iii) the vicinity (CS) of an intersection of the storage capacitor line 16 and the data signal line 12. That is, the photosensitive resin patterns 83A and 83B are provided on the first metal layer so as to have a thickness which is greater in an area corresponding to the gate electrode 11A than in areas corresponding to respective of the source and drain formation areas (SD). Then, while causing the photosensitive resin patterns 83A and 83B to serve as a mask, the first metal layer is selectively eliminated so that the glass substrate 2 is exposed (see (a) of FIG. 5 and (a) of FIG. 7).

Subsequently, with the use of an ashing means such as oxygen plasma, the thickness of the photosensitive resin patterns 83A and 83B is reduced by 1 μm or more so as to eliminate the photosensitive resin pattern 83B. This causes exposures of the gate electrode 11A in the source and drain formation areas (SD), the scanning signal line 11 in the vicinity (SG) of the intersection, and the storage capacitor line 16 in the vicinity (CS) of the intersection. Whereas, a photosensitive resin pattern 83C, whose thickness has been reduced, is left on the other areas of the scanning signal line 11, on the gate electrode 11A, and on the storage capacitor line 16 (see (b) of FIG. 5 and (b) of FIG. 7).

Then, a whole surface of the glass substrate 2 is subjected to a plasma treatment with the use of fluorocarbon gas such as CF4. Since the glass substrate 2 and the first metal layer are made of inorganic materials, their surfaces are hardly fluorinated. On the other hand, since the photosensitive resin pattern 83C is an organic resin, its surface is easily fluorinated, and accordingly the photosensitive resin pattern 83C becomes a photosensitive resin pattern 83C1 (see (c) of FIG. 5 and (c) of FIG. 7). Note that the surface of the photosensitive resin pattern 83C is successfully fluorinated, provided that the photosensitive resin pattern 83C has a surface depth of 100 Å or more.

A transparent inorganic resin, which is prepared by dissolving oxide silicon fine powder and a binder in a solvent and serves as a transparent inorganic insulating resin 60, is applied onto the glass substrate 2. Then, the transparent inorganic insulating resin 60 is repelled by the photosensitive resin pattern 83C1 because the photosensitive resin pattern 83C1, which has been fluorinated, has water repellency. Accordingly, the transparent inorganic insulating resin 60 is applied, in a self-aligning manner, to an area of the glass substrate 2 in which area the photosensitive resin pattern 83C1 is excluded (see (c) of FIG. 5 and (c) of FIG. 7). According to the present embodiment, the transparent inorganic insulating resin 60 has a thickness of, for example, 0.3 μm.

After the transparent inorganic insulating resin 60 is applied, the solvent, which is contained in the transparent inorganic insulating resin 60, is evaporated by heating so as not to be an obstacle to removing of the photosensitive resin pattern 83C1 by using a resist separation solution. Then, a polymer on the fluorinated surface is eliminated by an ashing means such as oxygen plasma, and then the photosensitive resin pattern 83C1 is eliminated with the use of the resist separation solution (see (d) of FIG. 5 and (d) of FIG. 7).

Subsequent processes are identical to those of a five-mask process of a conventional channel-etch transistor. That is, three types of thin film layers, i.e., a first SiNx layer 30, a first amorphous silicon layer 31, and a second amorphous silicon layer 33 (33A) are sequentially stacked all over the glass substrate 2 with the use of a PCVD (plasma chemical vacuum deposition) device (see (d) of FIG. 5 and (d) of FIG. 7). Note that the first SiNx layer 30 serves as a gate insulating layer having a thickness of, for example, approximately 0.3 μm. The first amorphous silicon layer 31 (i) has a thickness of, for example, approximately 0.2 μm, (ii) hardly contains an impurity, and (iii) serves as a channel section of the transistor. The second amorphous silicon layer 33 (i) has a thickness of, for example, approximately 0.05 μm, (ii) contains an impurity, and (iii) serves as a source electrode and a drain electrode of the transistor. Then, a semiconductor layer, which is prepared by stacking the first amorphous silicon layer 31A and the second amorphous silicon layer 33A, is selectively deposited on the gate electrode 11A with the use of a microfabrication technique. Note that the gate insulating layer 30 is exposed in an area other than an area in which the semiconductor layer is provided.

Then, in a step of forming a source line 12 and a drain line 21, a second metal layer (metal layer for source and drain lines) is deposited all over the glass substrate 2 with the use of a vacuum film-depositing device such as an SPT. Then, the second metal layer and the second amorphous silicon layer 33A are etched so as to be eliminated, and the first amorphous silicon layer 31A is etched so as to have a thickness of approximately 0.05 μm to 0.1 μm. In this manner, a data signal line 12, which is made up of a second metal layer 35A and serves also as a source electrode, is selectively formed so that the data signal line 12 and the gate electrode 11A partially overlap each other. Similarly, a drain line 21, which is made up of a second metal layer 35B and serves also as a drain electrode, is selectively formed so that the drain line 21 and the gate electrode 11A partially overlap each other (see (a) of FIG. 6 and (a) of FIG. 8). Note that the second metal layer has a stacking layer configuration in which the heat-resistant metal layer 34, the low-resistance metal layer 35, and the buffer metal layer 36 are stacked.

After the source line 12 and drain line 21 are formed, a passivation insulating layer 37 serving as a transparent insulating layer is formed by depositing a second SiNx layer, which has a thickness of approximately 0.3 μm, all over the glass substrate 2 with the use of a PCVD device. Then, with the use of a microfabrication technique, (i) an opening 62 is formed above the drain electrode 21, (ii) an opening 63 is provided above a part 5 of the scanning signal line 11, and (iii) an opening 64 is provided above a part 6 of the data signal line 12. Note that (i) the parts 5 and 6 and (ii) an image display section do not overlap each other. Then, (i) the passivation insulating layer 37 in the opening 62 is eliminated so that a part of the drain electrode 21 is exposed, (ii) the passivation insulating layer 37 in the opening 64 is eliminated so that the part 6 is exposed, and (iii) the passivation insulating layer 37 and the gate insulating layer 30 in the opening 63 are eliminated so that the part 5 is exposed (see (b) of FIG. 6 and (b) of FIG. 8). Similarly, an opening 65 is formed above the storage capacitor line 16 so that the storage capacitor line 16 is partially exposed (see (b) of FIG. 6).

Lastly, for example, an ITO or IZO or a mixed crystal of them is deposited as a transparent conductive layer having a thickness of approximately 0.1 μm to 0.2 μm, with the use of a vacuum film-depositing device such as an SPT. Then, with the use of a microfabrication technique, a pixel electrode 22, an electrode terminal 5A of the scanning signal line 11, and an electrode terminal 6A of the data signal line 12 are selectively formed while securing, in the passivation insulating layer 37, the respective openings 62, 63, and 64. An active matrix substrate 71 is thus produced (see (c) of FIG. 6 and (c) of FIG. 8).

Note that the liquid crystal panel 70 is produced by combining the color filter substrate 9 and the active matrix substrate 71 which is produced in the above method. Moreover, according to the present embodiment, since the storage capacitor line 16 is provided, the storage capacitor 15 is obtained in an area where the drain electrode 21 and the storage capacitor line 16 overlap each other. In a case where no storage capacitor line is provided, a storage capacitor 15 can be secured by providing the drain electrode 21 and a previous scanning signal line 11 which is to be scanned before a current signal line 11 so that they partially overlap each other.

Embodiment 2

Figure 9:
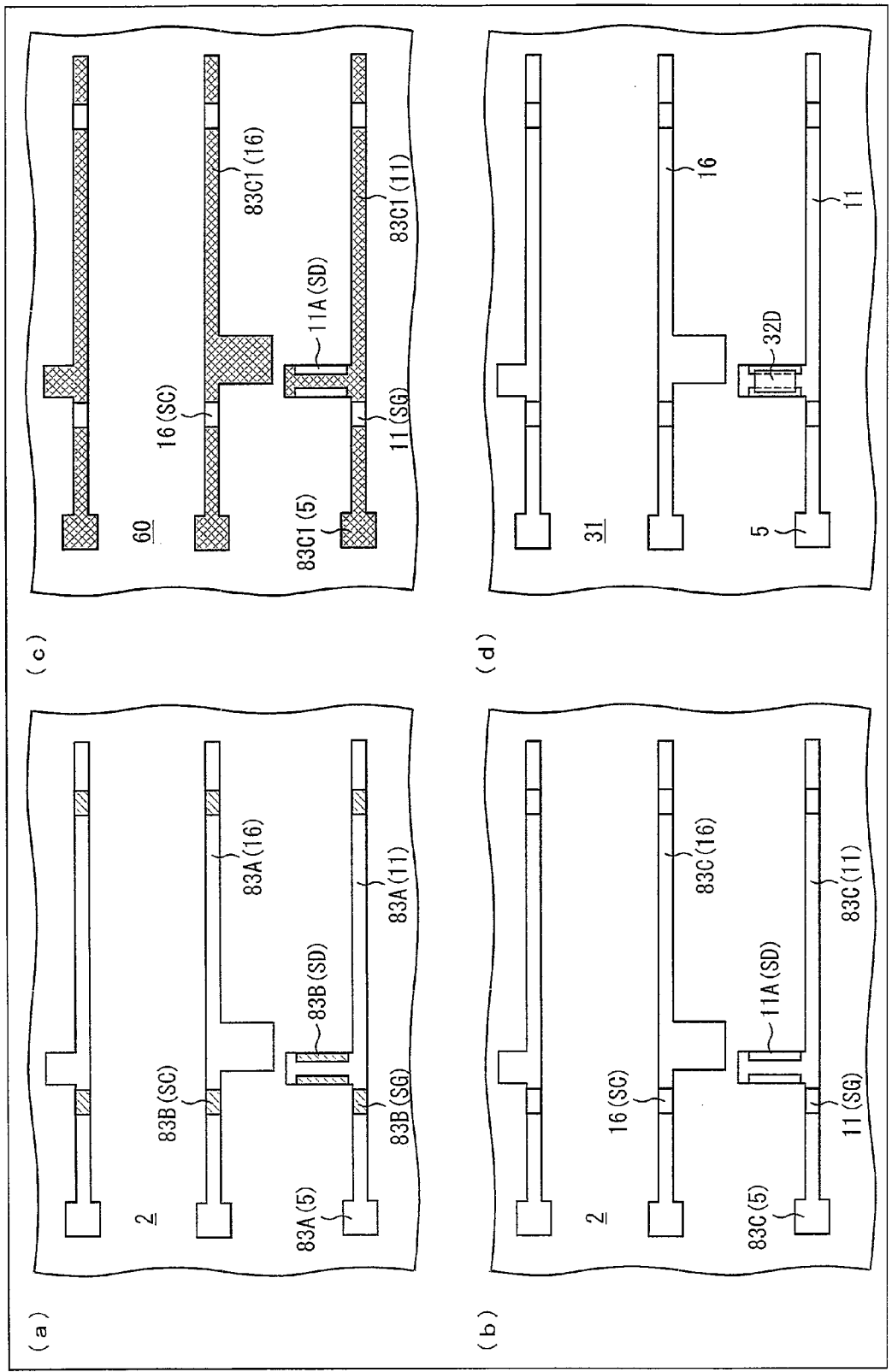
FIG. 9 is a plain view illustrating a production process of an active matrix substrate of Embodiment 2.
Figure 10:
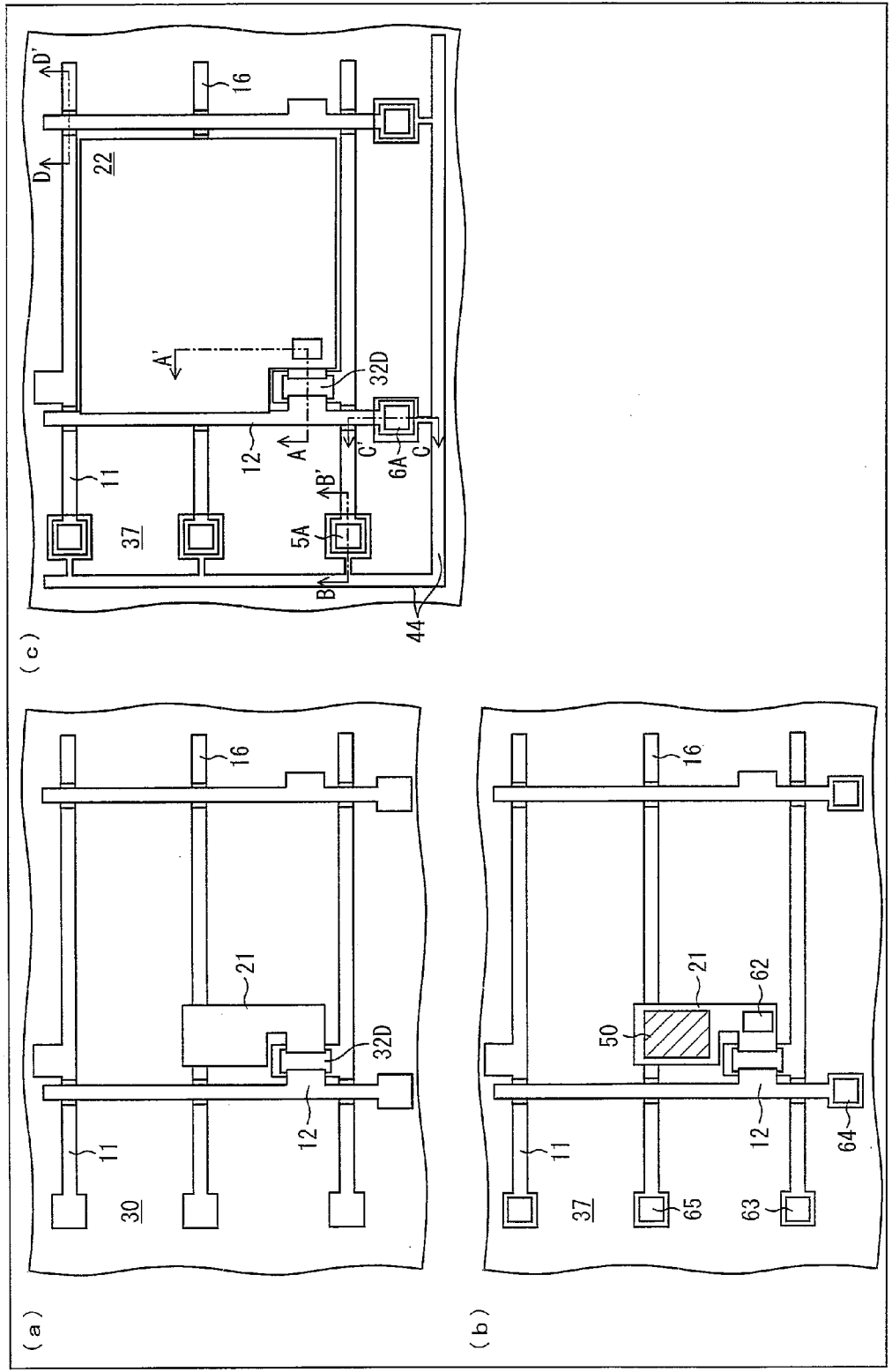
FIG. 10 is a plain view illustrating the production process of the active matrix substrate of Embodiment 2.
Figure 11:
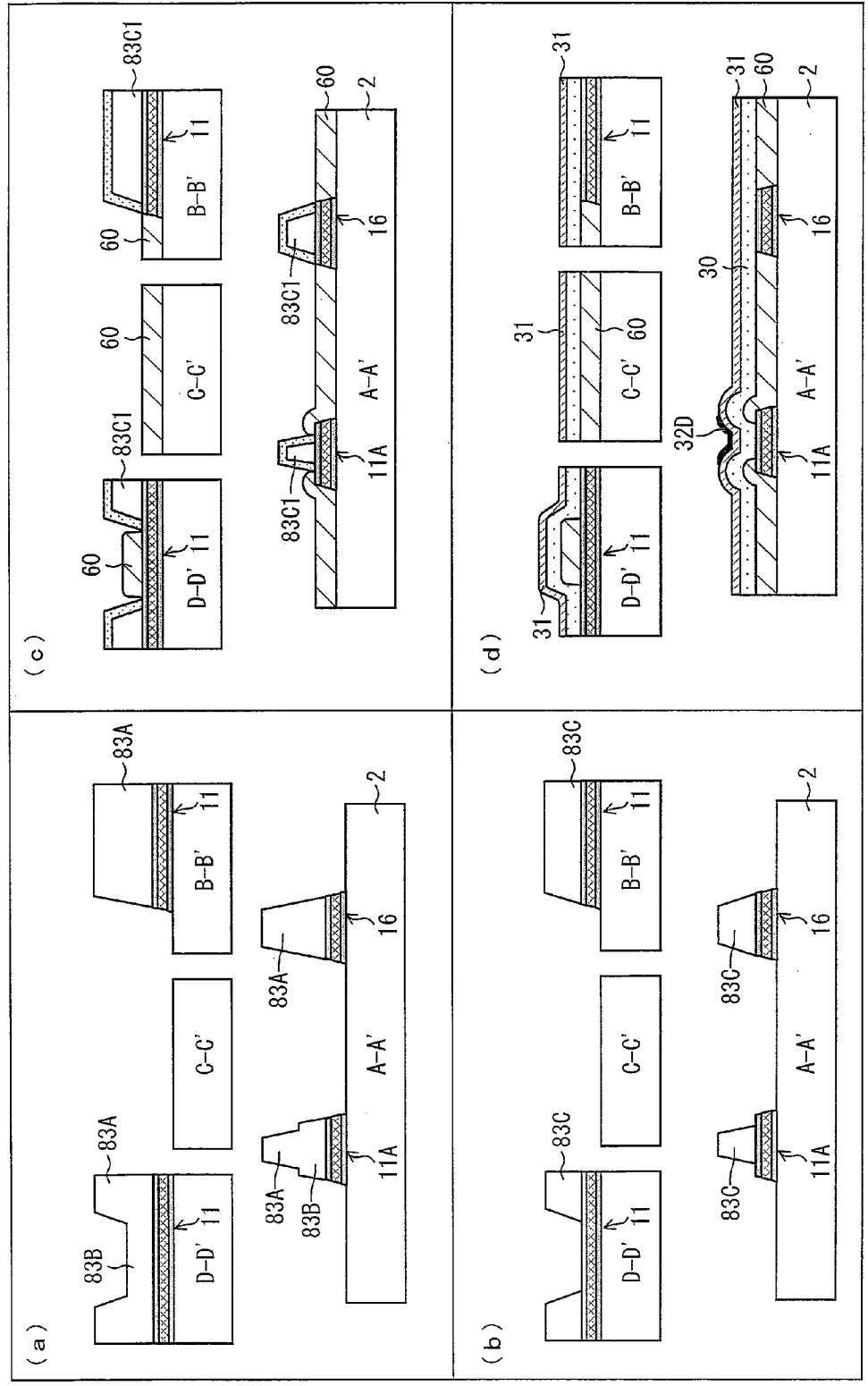
FIG. 11 is a cross-sectional view illustrating the production process of the active matrix substrate shown in FIG. 9, in which (a) through (d) of FIG. 11 correspond to (a) through (d) of FIG. 9, respectively.
Figure 12:
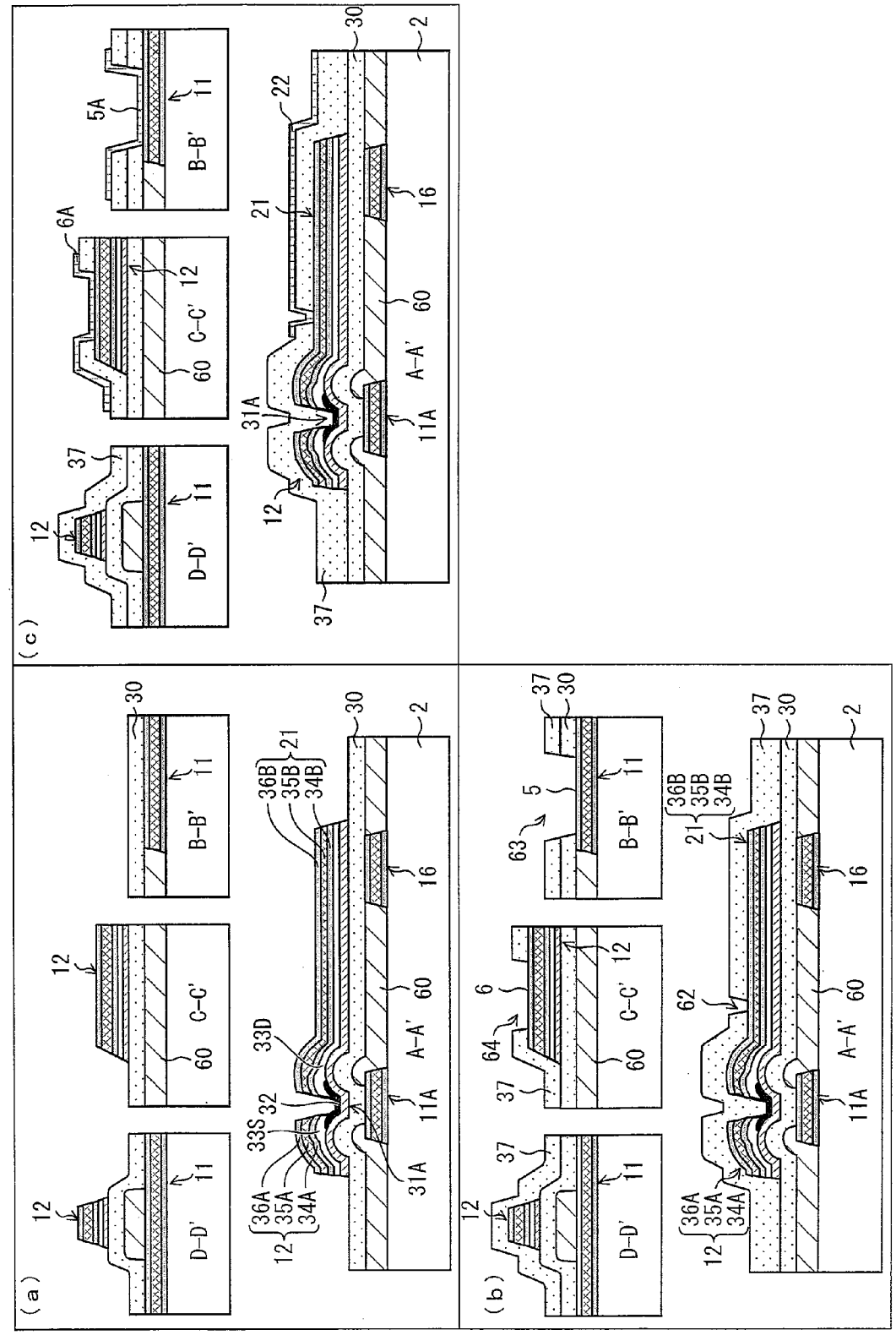
FIG. 12 is a cross-sectional view illustrating the production process of the active matrix substrate shown in FIG. 10, in which (a) through (c) of FIG. 12 correspond to (a) through (c) of FIG. 10, respectively.
Figure 13:
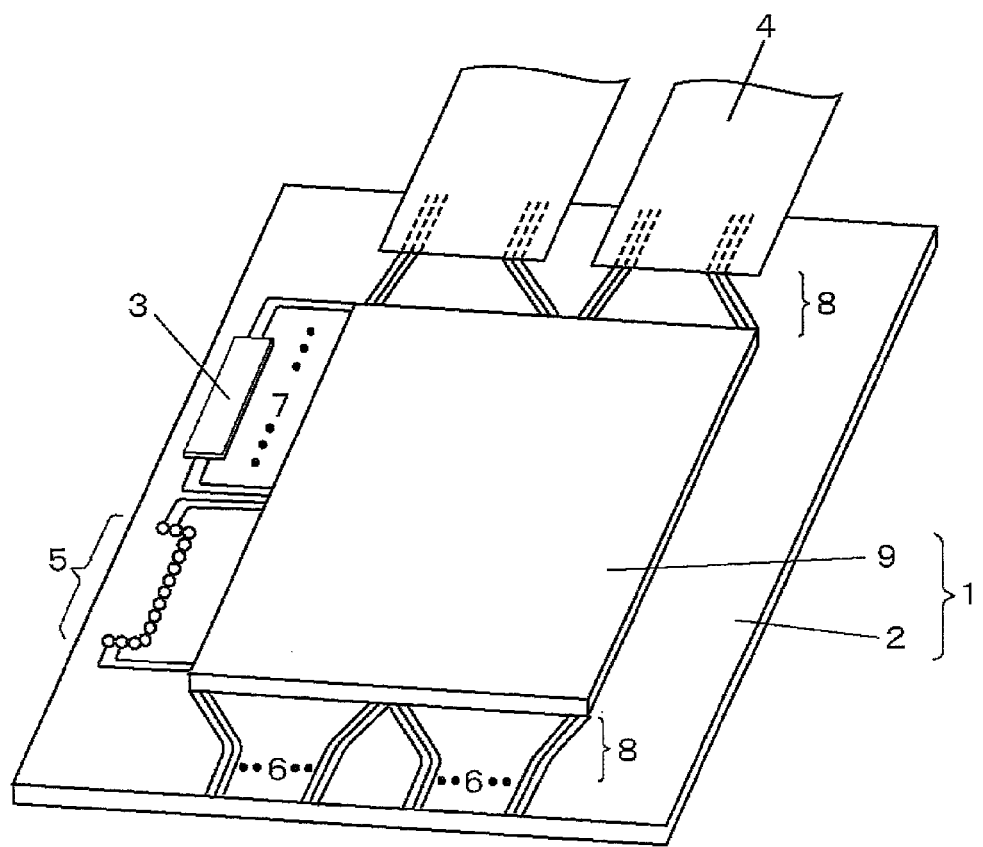
FIG. 13 is a perspective view illustrating a mounting condition of a conventional liquid crystal panel.
Figure 14:
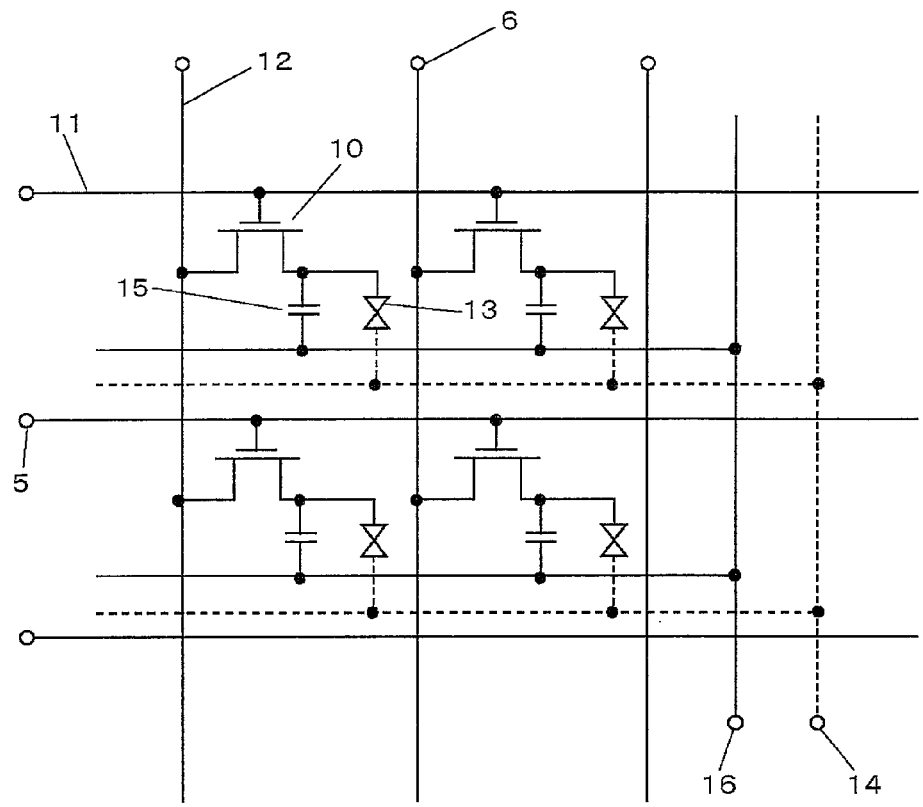
FIG. 14 is an equivalent circuit diagram illustrating the conventional liquid crystal panel.
Figure 15:
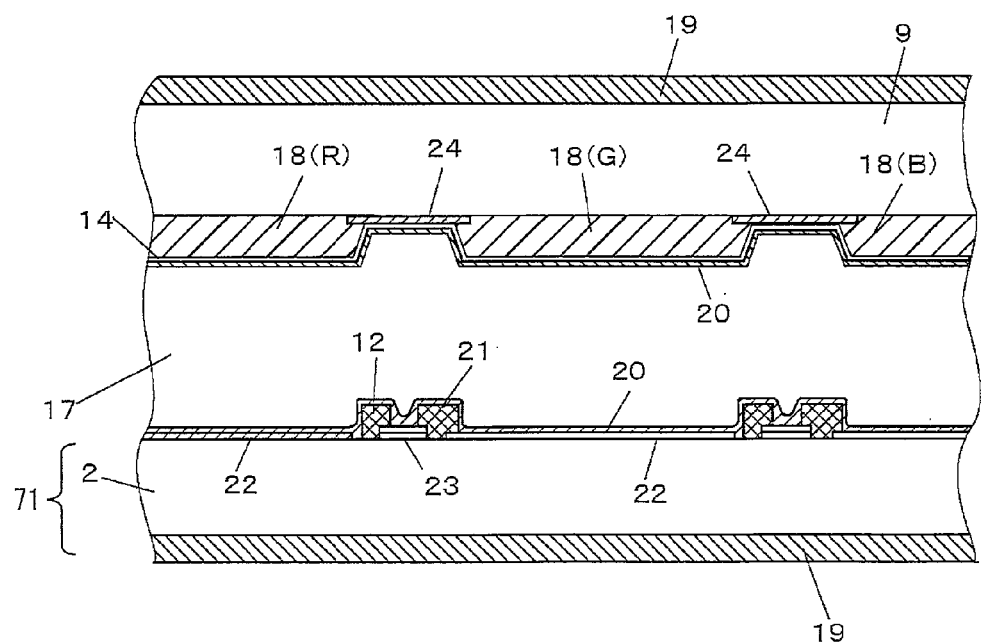
FIG. 15 is a cross-sectional view illustrating the conventional liquid crystal panel.
Figure 17:
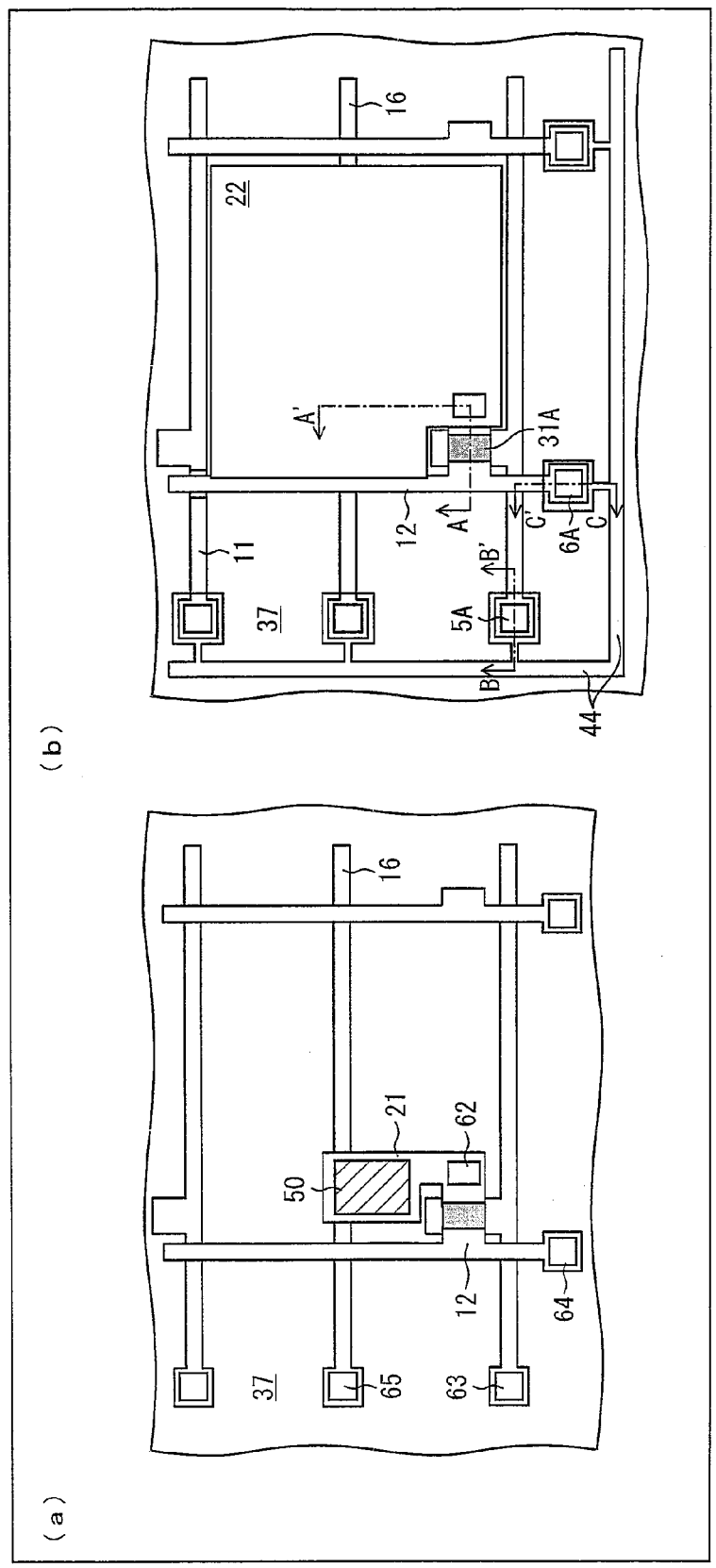
FIG. 17 is a plain view illustrating the production process of the conventional active matrix substrate.
Figure 18:
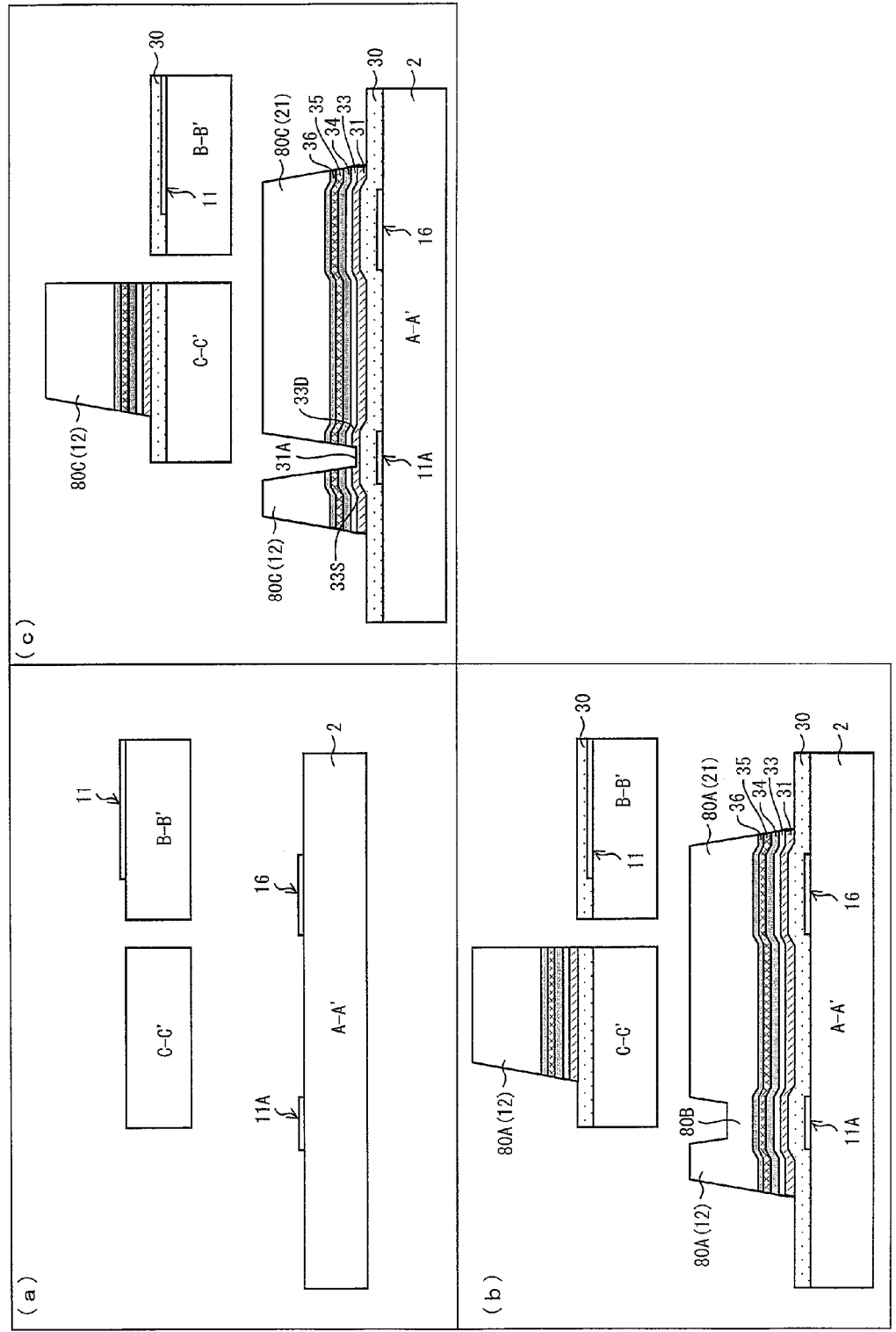
FIG. 18 is a cross-sectional view illustrating the production process of the active matrix substrate shown in FIG. 16, in which (a) through (c) of FIG. 18 correspond to (a) through (c) of FIG. 16, respectively.
Figure 19:
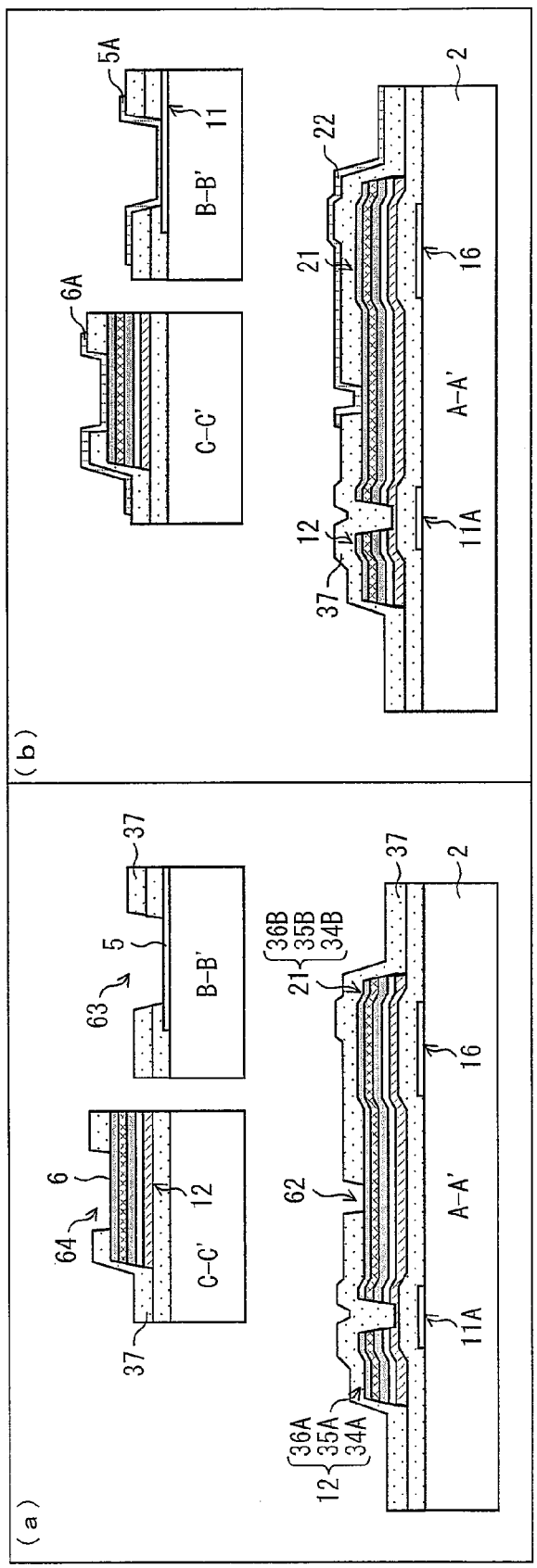
FIG. 19 is a cross-sectional view illustrating the production process of the active matrix substrate shown in FIG. 17, in which (a) and (b) of FIG. 19 correspond to (a) and (b) of FIG. 17, respectively.

FIGS. 9 and 10 are plain views which illustrate processes for producing an active matrix substrate (semiconductor device for display device) 71 of Embodiment 2. FIGS. 11 and 12 are cross-sectional views illustrating the active matrix substrate 71 shown in FIGS. 9 and 10. In FIGS. 11 and 12, an A-A' cross section shows a transistor area, a B-B' cross section shows an electrode terminal area of a scanning signal line 11, a C-C' cross section shows an electrode terminal area of a data signal line 12, and a D-D' cross section shows a cross section of the scanning signal line 11. Note that the lines (A-A', B-B', C-C', and D-D') correspond to those in (c) of FIG. 10. Moreover, plain views of (a) through (d) of FIG. 9 correspond to respective cross-sectional views of (a) through (d) of FIG. 11. Moreover, plain views of (a) through (c) of FIG. 10 correspond to respective cross-sectional views of (a) through (c) of FIG. 12.

According to Embodiment 2, steps preceding a selective application of the transparent inorganic insulating resin 60, that is, steps shown in (a) through (c) of FIG. 9 and (a) through (c) of FIG. 11 are identical to those shown in (a) through (c) of FIG. 5 and (a) through (c) of FIG. 7. Moreover, subsequent steps are identical to those of a conventional etch-stop five-mask process.

That is, three types of thin film layers, i.e., a first SiNx layer 30, a first amorphous silicon layer 31, and a second SiNx layer 32 are sequentially deposited all over the glass substrate 2 with the use of a PCVD (plasma chemical vacuum deposition) device (see (d) of FIG. 9 and (d) of FIG. 11). Note that the first SiNx layer 30 serves as a gate insulating layer having a thickness of, for example, approximately 0.3 μm. The first amorphous silicon layer 31 (i) has a thickness of, for example, approximately 0.05 μm, (ii) hardly contains an impurity, and (iii) serves as a channel section of the transistor. The second SiNx layer 32 (i) has a thickness of, for example, approximately 0.1 μm, and (ii) serves as an insulating layer which protects a channel. Then, the second SiNx layer above the gate electrode 11A is selectively left, with the use of a photosensitive resin pattern, based on a microfabrication technique so as to (i) be narrower than a width of the gate electrode 11A and (ii) serve as a protective insulating layer 32D. As a result, the first amorphous silicon layer 31 is exposed.

Subsequently, a second amorphous silicon layer 33, which has a thickness of, for example, approximately 0.05 μm and contains, for example, phosphorus as an impurity, is deposited so as to cover all over the glass substrate 2 with the use of the PCVD device. Then, for example, a thin film layer 34, an Al thin film layer 35, and a Ti thin film layer 36 are sequentially deposited with the use of a vacuum film-depositing device such as an SPT. Note that (i) the thin film layer 34 is a heat-resistant metal layer which is made of a material such as Ti, Cr, or Mo, and has a thickness of approximately 0.1 μm, (ii) the Al thin film layer 35 serves as a low-resistance wiring layer having a thickness of approximately 0.3 μm, and (iii) the Ti thin film layer 36 serves as an intermediate conductive layer having a thickness of approximately 0.1 μm. Then, a data signal line 12, which serves also as a source electrode of the transistor, is selectively formed by stacking three types of thin film layers (materials for source line and drain line), i.e., thin film layers 34A, 35A, and 36A with the use of a photosensitive resin pattern based on a microfabrication technique so that the data signal line 12 and the gate electrode 11A partially overlap each other. Similarly, a drain line 21, which serves also as a drain electrode of the transistor, is selectively deposited by stacking three types of thin film layers, i.e., thin film layers 34B, 35B, and 36B (see (a) of FIG. 10 and (a) of FIG. 12). The selective patterning is carried out as follows. First, the Ti thin film layer 36, the Al thin film layer 35, and the Ti thin film layer 34 are sequentially etched while causing the photosensitive resin pattern, which is used in forming the source and drain lines, to serve as a mask. Then, the selective patterning is carried out by (i) causing the second amorphous silicon layer 33 formed between the source electrode and the drain electrode 21 to be eliminated so that the protective insulating layer 32D is exposed and (ii) causing, in the other area, the first amorphous silicon layer 31 to be also eliminated so that the gate insulating layer 30 is exposed.

This is called etch-stop process because the etching of the second amorphous silicon layer 33 automatically ends due to the presence of the second SiNx layer 32D (protective insulating layer, etch-stop layer, or channel protective layer) which is a protective layer of the channel section 31A. Note that the source electrode 12 and the drain electrode 21 are formed so that (i) the source electrode 12 and the drain electrode 21 and (ii) a part of the protective insulating layer 32D two-dimensionally and partially overlap each other, by several micrometers. This allows prevention of the transistor from having an offset configuration. It is preferable that the part of the protective insulating layer 32D is as small as possible because the part of the protective insulating layer 32D electrically acts as a parasitic capacitor. The dimension of the part of the protective insulating layer 32D is determined based on (i) an alignment accuracy of an exposure device, (ii) an accuracy of a photomask, (iii) an expansion coefficient of a glass substrate, and (iv) a temperature of the glass substrate under exposure. The practical dimension of the part of the protective insulating layer 32D is at most approximately 2 μm.

After the photosensitive resin pattern is eliminated, a passivation insulating layer 37, serving as a transparent insulating layer, is formed by depositing an SiNx layer, which has a thickness of approximately 0.3 μm, all over the glass substrate 2 with the use of a PCVD device as with the gate insulating layer 30. Then, based on a microfabrication technique with the use of a photosensitive resin pattern, (i) an opening 62 is formed above the drain electrode 21, (ii) an opening 63 is formed above a part 5 of the scanning signal line 11, and (iii) an opening 64 is formed above a part 6 of the data signal line 12. Note that (i) the parts 5 and 6 and (ii) an image display section do not overlap each other. Then, (i) the passivation insulating layer 37 is eliminated from the opening 62 so that a part of the drain electrode 21 is exposed, (ii) the passivation insulating layer 37 is eliminated from the opening 64 so that the part 6 is exposed, and (iii) the passivation insulating layer 37 and the gate insulating layer 30 are eliminated from the opening 63 so that the part 5 is exposed (see (b) of FIG. 10 and (b) of FIG. 12). Similarly, an opening 65 is provided above the storage capacitor line 16 (i.e., an electrode pattern made up of a bundle of parallel storage capacitor lines 16) so that the storage capacitor line 16 is partially exposed (see (b) of FIG. 10).

Lastly, for example, an ITO or IZO or a mixed crystal of them is deposited as a transparent conductive layer having a thickness of approximately 0.1 μm to 0.2 μm, with the use of a vacuum film-depositing device such as an SPT. Then, based on a microfabrication technique with the use of the photosensitive resin pattern, a pixel electrode 22, an electrode terminal 5A of the scanning signal line 11, and an electrode terminal 6A of the data signal line 12 are selectively formed above the passivation insulating layer 37 and the respective openings 62, 63, and 64. The active matrix substrate 71 is thus prepared (see (c) of FIG. 10 and (c) of FIG. 12).

Note that the liquid crystal panel 70 is produced by combining the active matrix substrate 71 thus prepared and the color filter substrate 9. Since the storage capacitor line 16 is provided in the present embodiment, the storage capacitor 15 is obtained in an area where the drain electrode 21 and the storage capacitor line 16 overlap each other. In a case where no storage capacitor line 16 is provided, a storage capacitor 15 can be secured by providing the drain electrode 21 and a previous scanning signal line which is to be scanned before a current signal line so that they partially overlap each other.

According to the active matrix substrate 71 of the present embodiment, the transparent inorganic insulating layer 60 is selectively provided between the gate insulating layer 30 and areas (source and drain areas) above both edge parts of the gate electrode 11A of the transistor 10. This makes it possible to reduce a parasitic capacitor defined by (i) the gate electrode 11A and (ii) respective of the source electrode 12 and the drain electrode 21 which overlap each other two-dimensionally. Such parasitic capacitors are more reduced as the transparent inorganic insulating layer has a larger thickness. In a case where the transparent inorganic insulating layer has a thickness substantially equal to that of the gate insulating film, parasitic capacitors have capacities which are cut into substantially half. Moreover, only the gate insulating layer is provided between the channel section and the center (channel area) of the gate electrode in the transistor. This makes it possible to prevent a deterioration in characteristics of the transistor, as compared to a conventional technique.

Moreover, according to the liquid crystal display device 100 of the present invention, it is possible to cut power consumption of the drivers into half because the parasitic capacitor has a capacity which is cut into half. Since the time constant is small, it is possible to easily fulfill the latest demands, such as an enlargement of a display screen and double-speed driving, in a technical field in which a TV is employed.

It is a known technique that parasitic capacitors, which are caused at intersections of scanning signal lines 11 and data signal lines 12 and at intersections of storage capacitor lines 16 and the data signal lines 12, can be reduced by providing semiconductor layers having no impurity at the respective intersections. Therefore, parasitic capacitors in the liquid crystal display device can be further reduced by (i) providing the second amorphous silicon layer and the first amorphous silicon layer in the channel-etch insulated gate transistor of Embodiment 1 and (ii) providing the protective insulating layer and the first amorphous silicon layer in the etch-stop insulated gate transistor of Embodiment 2. As such, the reduction in parasitic capacitors achieved by Embodiments 1 and 2 of the present invention are very effective for the conventional four-mask channel-etch insulated gate transistor, in which a second amorphous silicon layer and a first amorphous silicon layer are provided under source and drain lines.

According to the production method of the present invention, it is possible to suppress to the minimum an increase in production steps because an additional insulating layer for reducing parasitic capacitors is provided in the source and drain formation areas with the use of (i) the selective thin film formation technique which makes use of water repellency and (ii) the halftone exposure technique.

The gist of one aspect of the present invention resides in the insulated gate transistor which can reduce parasitic capacitors defined by the gate and source and defined by the gate and drain. Such a reduction in parasitic capacitors can be attained by combining (i) the selective formation of the transparent inorganic insulating layer which selective formation is carried out with the use of water repellency and (ii) the halftone exposure technique with which the transparent inorganic insulating layer can be selectively formed in the edge parts of the gate electrode in a self-aligning manner.

According to the liquid crystal display device including the insulated gate transistor which hardly causes a parasitic capacitor, the transparent inorganic insulating layer is additionally provided, in a self-aligning manner, at the intersections of (i) the signal line and (ii) the source and drain formation areas in the edge parts of the gate electrode. This makes it possible to increase a dielectric strength voltage between (i) the scanning line (scanning signal line) having the gate electrode and (ii) the signal line (data signal line), and therefore a fabrication yield can be increased.

Moreover, this also makes it possible to (i) easily achieve low power consumption by reducing driving power and (ii) reduce the time constants of the scanning line and the signal line. Accordingly, distortion of a waveform caused by a delay of an electric signal can be reduced, and it therefore becomes easy to secure a video image with high image quality.

Besides, it is possible to suppress an increase in a thickness of a scanning line in a case where a liquid crystal display device having a large screen is produced. Moreover, effects, which are similar to those described above, can be brought about in a liquid crystal display device which can carry out double speed writing for addressing moving images. As above, various excellent effects can be attained.

According to the present invention, merely the transparent inorganic insulating layer is selectively provided between the gate insulating layer and the areas above the respective edge parts of the gate electrode. Such a configuration does not conflict with the other basic configurations of the insulated gate transistor. Accordingly, it is possible to apply the configuration of the present invention to a channel-etch insulated gate transistor and also to an etch-stop insulated gate transistor in which a protective insulating layer is provided above a channel. Moreover, a relation between the insulated gate transistor and pixel electrodes does not change. Therefore, the configuration is effectively applicable to liquid crystal display devices of respective transmissive type, reflection type, and transflective type. Further, it is possible, of course, to effectively apply the configuration of the present invention to (i) a TN liquid crystal mode, (ii) an IPS liquid crystal mode which operates in a transverse electric field, and (iii) a vertical alignment liquid crystal mode, by modifying the patterning shape of the transparent conductive pixel electrode.

Note that, according to the insulated gate transistor of the present invention, it is possible that: a gate electrode, made up of at least one metal layer, is provided on a main surface of a transparent insulating substrate; a transparent inorganic insulating layer is provided (i) in source and drain formation areas above the gate electrode and (ii) above a main surface of a first transparent insulating substrate (that is, in an area except for a channel area above the gate electrode); and a source line and a drain line are provided so that (i) the source line and drain line and (ii) the respective source and drain formation areas overlap each other via at least a gate insulating layer and a semiconductor layer.

Moreover, the liquid crystal display device of the present invention can include: a first transparent insulating substrate (active matrix substrate) which has a main surface on which at least (i) insulated gate transistors, each of which is a channel-etch insulated gate transistor, (ii) scanning signal lines serving also as gate electrodes of the respective insulated gate transistors, (iii) signal lines serving also as source lines, and (iv) unit pixels, having respective pixel electrodes connected with drain lines, are provided, the unit pixels being two-dimensionally arranged in a matrix manner; a second transparent insulating substrate or a color filter which faces the first transparent insulating substrate; and liquid crystal provided between the first transparent insulating substrate and the second transparent insulating substrate or the color filter, wherein: on the main surface of the first transparent insulating substrate, the scanning signal lines, a transparent inorganic insulating layer, the source lines and drain lines, and the pixel electrodes are provided, the scanning signal line being made up of at least one metal layer, the transparent inorganic insulating layer being provided (i) in source and drain formation areas above each of the gate electrodes and (ii) in an area on a main surface of the first transparent insulating substrate, the area being not the vicinity of intersections of the scanning lines and the signal lines, and the source lines and the drain lines being provided so that (i) the source lines and drain lines and (ii) the respective source and drain formation areas overlap each other via at least a gate insulating layer and a semiconductor layer.

Moreover, the method of the present invention for producing the insulated gate transistor can include the steps of: (a) forming at least one metal layer on a main surface of a transparent insulating substrate; (b) forming a photosensitive resin pattern on the at least one metal layer so that the photosensitive resin pattern has a thickness which is thicker in an area corresponding to a gate electrode than in areas corresponding to respective source and drain formation areas; (c) selectively forming a gate electrode pattern, made up of the at least one metal layer, with use of the photosensitive resin pattern; (d) exposing the at least one metal layer in the source and drain formation areas above respective edge parts of the gate electrode by reducing a thickness of the photosensitive resin pattern; (e) fluorinating a surface of the photosensitive resin pattern by dry etching with fluorine gas, after the step (d); (f) applying transparent inorganic insulating resin onto the surface which has been fluorinated; (g) removing the photosensitive resin pattern, which has been fluorinated; (h) forming at least a gate insulating layer and a semiconductor layer; and (i) forming source lines and drain lines so that (a) the source lines and the drain lines and (b) the source and drain formation areas, respectively, overlap each other.

Moreover, the method of the present invention for producing the liquid crystal display device can be a method for producing a liquid crystal display device which is configured by providing liquid crystal between a first transparent insulating substrate (active substrate) and a second transparent insulating substrate or a color filter which faces the first transparent insulating substrate, the method can include, in producing the active substrate, the steps of: (a) forming at least one metal layer on a main surface of a transparent insulating substrate; (b) forming a photosensitive resin pattern on the at least one metal layer so that the photosensitive resin pattern has a thickness which is thicker in an area corresponding to a scanning line electrode than in an area corresponding to source and drain formation areas and the vicinity of intersections of scanning lines and signal lines; (c) selectively forming a scanning line pattern made up of the at least one metal layer, with use of the photosensitive resin pattern; (d) exposing the at least one metal layer (i) in the source and drain formation areas located in both edge parts of the gate electrode and (ii) in the intersections by reducing a thickness of the photosensitive resin pattern; (e) fluorinating a surface of the photosensitive resin pattern by dry etching with fluorine gas, after the step (d); (f) applying transparent inorganic insulating resin onto the surface which has been fluorinated;

(g) removing the photosensitive resin pattern, which has been fluorinated; (h) forming at least a gate insulating layer and a semiconductor layer; (i) forming source lines and drain lines so that (A) (I) the source lines and drain lines and (II) the signal lines overlap each other via the gate insulating layer and (B) (I) the source lines and drain lines and (II) the respective source and drain formation areas overlap each other via the gate insulating layer and the semiconductor layer; and (j) providing pixel electrodes, which are connected with the respective drain electrodes.

In order to attain the object, an insulated gate transistor of the present invention with a gate electrode, a source electrode, and a drain electrode, includes: a transparent insulating substrate; and an insulating layer, the gate electrode being provided on a main surface of the transparent insulating substrate, and a first part of the insulating layer being thicker than a second part of the insulating layer, the first part being between the gate electrode and respective of the source electrode and the drain electrode, and the second part being between the gate electrode and a channel section of the insulated gate transistor.

According to the insulated gate transistor, it is possible that the insulating layer encompasses at least a gate insulating layer; the gate electrode and the channel section overlap each other via the gate insulating layer; and (i) the gate electrode and (ii) each of the source electrode and the drain electrode overlap each other via at least the gate insulating layer and a transparent inorganic insulating layer.

Note that, it is possible that (i) the gate electrode and (ii) the source electrode and drain electrode can overlap each other via, for example, an insulating layer made of $TaO_2$ or $Al_2O_3$ prepared by anodizing a surface of a gate electrode made of Ta or Al, in addition to via the gate insulating layer and the transparent inorganic insulating layer.

Moreover, an active matrix substrate of the present invention includes: a data signal line; a scanning signal line; an insulated gate transistor, which has a gate electrode, a source electrode, and a drain electrode and which is connected with the data signal line and the scanning signal line; and a pixel electrode which is connected with the data signal line via the insulated gate transistor, a first part of an insulating layer being thicker than a second part of the insulating layer, the first part being between the gate electrode and respective of the source electrode and the drain electrode, and the second part being between the gate electrode and a channel section of the insulated gate transistor.

According to the active matrix substrate, it is possible that: the insulating layer encompasses at least a gate insulating layer; the gate electrode and the channel section overlap each other via the gate insulating layer; and (i) the gate electrode and (ii) each of the source electrode and the drain electrode overlap each other via at least the gate insulating layer and a transparent inorganic insulating layer.

Moreover, a liquid crystal display device of the present invention includes: a first transparent insulating substrate having a main surface on which unit pixels are two-dimensionally provided in a matrix manner, each of the unit pixels including (i) an insulated gate transistor, which is a channel-etch insulated gate transistor with a gate electrode, a source electrode, and a drain electrode, (ii) a scanning signal line serving also as the gate electrode, (iii) a data signal line serving also as the source electrode, and (iv) a pixel electrode which is connected with a drain line serving also as the drain electrode; a second transparent insulating substrate or a color filter which faces the first transparent insulating substrate; and liquid crystal provided between the first transparent insulating substrate and the second transparent insulating substrate or the color filter, the scanning signal line being made up of at least one metal layer provided on the main surface of the first transparent insulating substrate, and a first part of an insulating layer being thicker than a second part of the insulating layer, the first part being between the gate electrode and respective of the source electrode and the drain electrode, and the second part being between the gate electrode and a channel section of the insulated gate transistor.

According to the liquid crystal display device, it is possible that: the insulating layer encompasses at least a gate insulating layer; the gate electrode and the channel section overlap each other via the gate insulating layer; and (i) the gate electrode and (ii) each of the source electrode and the drain electrode overlap each other via at least the gate insulating layer and a transparent inorganic insulating layer.

According to the configurations, it is possible to cause a distance between (i) the gate electrode and (ii) the source and drain electrodes to be larger than that between the gate electrode and the channel section. Specifically, for example, the source and drain electrodes and the gate electrode overlap each other via the gate insulating layer and the transparent inorganic insulating layer. It is therefore possible to cause the distance between (i) the gate electrode and (ii) the source and drain electrodes to be larger than a conventional configuration in which only a gate insulating layer is provided between (i) a gate electrode and (ii) source and drain electrodes. This makes it possible to reduce (i) a parasitic capacitor between the gate and the source and (ii) a parasitic capacitor between the gate and the drain. Moreover, the channel section and the gate electrode overlap each other via only the gate insulating layer, as with the conventional configuration. Therefore, characteristics of the transistor are not deteriorated.

As described above, a film thickness between (i) the gate electrode and (ii) the source and drain electrodes can be increased while the film thickness between the gate electrode and the channel section is maintained at the same level as the conventional configuration. This makes it possible to reduce parasitic capacitors without deteriorating characteristics of the transistor, as compared to the conventional configuration.

According to the insulated gate transistor, it is possible that: the transparent inorganic insulating layer is provided on the transparent insulating substrate so as to cover a first area on the gate electrode other than a second area where the second area and the channel section overlap each other, in which first area the first area and respective of the source area and the drain area overlap each other; and the gate insulating layer is provided so as to cover the transparent inorganic insulating layer and the second area.

According to the active matrix substrate, it is possible that: the gate electrode is provided on the transparent insulating substrate; the transparent inorganic insulating layer is provided on the transparent insulating substrate so as to cover a first area on the gate electrode other than a second area where the second area and the channel section overlap each other, in which first area the first area and respective of the source area and the drain area overlap each other; and the gate insulating layer is provided so as to cover the transparent inorganic insulating layer and the second area.

According to the liquid crystal display device, it is possible that: the gate electrode is provided on the transparent insulating substrate; the transparent inorganic insulating layer is provided on the transparent insulating substrate so as to cover a first area on the gate electrode other than a second area where the second area and the channel section overlap each other, in which first area the first area and respective of the source area and the drain area overlap each other; and the gate insulating layer is provided so as to cover the transparent inorganic insulating layer and the second area.

Accordingly, it is possible to achieve a configuration in which the channel section and the gate electrode overlap each other via only the gate insulating layer, whereas (i) the source electrode and the drain electrode and (ii) the gate electrode overlap each other via the gate insulating layer and the transparent inorganic insulating resin.

In order to attain the object, a method for producing an insulated gate transistor of the present invention includes the steps of: (a) forming at least one metal layer on a main surface of a transparent insulating substrate; (b) forming a photosensitive resin pattern on the at least one metal layer so that the photosensitive resin pattern has a thickness which is thicker in an area corresponding to a gate electrode than in an area corresponding to source and drain formation areas; (c) selectively forming a gate electrode pattern, made up of the at least one metal layer, with use of the photosensitive resin pattern; (d) exposing the at least one metal layer in the source and drain formation areas above respective edge parts of the gate electrode, by reducing a thickness of the photosensitive resin pattern; (e) fluorinating a surface of the photosensitive resin pattern, whose thickness has been reduced, by dry etching with fluorine gas; (f) applying transparent inorganic insulating resin onto the surface which has been fluorinated in the step (e); (g) removing the photosensitive resin pattern, which has been fluorinated; (h) forming at least a gate insulating layer and a semiconductor layer; and (i) forming source and drain lines so that (a) the source and drain lines and (b) the source and drain formation areas, respectively, overlap each other.

Moreover, a method for producing an active matrix substrate of the present invention is a method for producing an active matrix substrate in which a transparent insulating substrate having a main surface on which unit pixels are two-dimensionally provided in a matrix manner, each of the unit pixels including (i) an insulated gate transistor, which is a channel-etch insulated gate transistor with a gate electrode, a source electrode, and a drain electrode, (ii) a scanning signal line serving also as the gate electrode, (iii) a data signal line serving also as the source electrode, and (iv) a pixel electrode which is connected with a drain line serving also as the drain electrode, the method including the steps of: (a) forming at least one metal layer on a main surface of a transparent insulating substrate; (b) forming a photosensitive resin pattern on the at least one metal layer so that the photosensitive resin pattern has a thickness which is thicker in an area corresponding to the gate electrode than in an area corresponding to source and drain formation areas; (c) selectively forming a gate electrode pattern, made up of the at least one metal layer, with use of the photosensitive resin pattern; (d) exposing the at least one metal layer in the source and drain formation areas above respective edge parts of the gate electrode, by reducing a thickness of the photosensitive resin pattern; (e) fluorinating a surface of the photosensitive resin pattern, whose thickness has been reduced, by dry etching with fluorine gas; (f) applying transparent inorganic insulating resin onto the surface which has been fluorinated in the step (e); (g) removing the photosensitive resin pattern, which has been fluorinated; (h) forming at least a gate insulating layer and a semiconductor layer; (i) forming source and drain lines so that (a) the source and drain lines and (b) the source and drain formation areas, respectively, overlap each other; (j) forming a passivation insulating layer after the step (i); (k) forming an opening in the passivation insulating layer, the opening being provided partially above the drain electrode; and (l) forming a transparent conductive layer, serving as a pixel electrode, on the passivation insulating layer and in the opening.

Moreover, a method for producing a liquid crystal display device of the present invention is a method for producing a liquid crystal display device which includes: an active matrix substrate having a main surface on which unit pixels are two-dimensionally provided in a matrix manner, each of the unit pixels including (i) an insulated gate transistor, which is a channel-etch insulated gate transistor with a gate electrode, a source electrode, and a drain electrode, (ii) a scanning signal line serving also as the gate electrode, (iii) a data signal line serving also as the source electrode, and (iv) a pixel electrode which is connected with a drain line serving also as the drain electrode; a counter substrate or a color filter which faces the first transparent insulating substrate; and liquid crystal provided between the active matrix substrate and the counter substrate or the color filter, the method including the steps of: (a) forming at least one metal layer on a main surface of a transparent insulating substrate included in the active matrix substrate; (b) forming a photosensitive resin pattern on the at least one metal layer so that the photosensitive resin pattern has a thickness which is thicker in an area corresponding to the gate electrode than in an area corresponding to source and drain formation areas; (c) selectively forming a gate electrode pattern, made up of the at least one metal layer, with use of the photosensitive resin pattern; (d) exposing the at least one metal layer in the source and drain formation areas above respective edge parts of the gate electrode, by reducing a thickness of the photosensitive resin pattern; (e) fluorinating a surface of the photosensitive resin pattern, whose thickness has been reduced, by dry etching with fluorine gas; (f) applying transparent inorganic insulating resin onto the surface which has been fluorinated in the step (e); (g) removing the photosensitive resin pattern, which has been fluorinated; (h) forming at least a gate insulating layer and a semiconductor layer; (i) forming source and drain lines so that (a) the source and drain lines and (b) the source and drain formation areas, respectively, overlap each other; (j) forming a passivation insulating layer after the step (i); (k) forming an opening in the passivation insulating layer, the opening being provided partially above the drain electrode; and (l) forming a transparent conductive layer, serving as a pixel electrode, on the passivation insulating layer and in the opening.

According to the method, the metal layer in the source and drain formation areas, which are located above the respective edge parts of the gate electrode, is exposed in accordance with the photosensitive resin pattern, which is fluorinated so as to have water repellency. Accordingly, transparent insulating resin applied to the glass substrate is repelled by the photosensitive resin pattern, and therefore the transparent insulating resin is to be applied, in a self-aligning manner, to the area in which the photosensitive resin pattern is not provided.

Then, the gate insulating film and the source and drain lines are provided so that (i) the source and drain lines and the gate electrode overlap each other via the gate insulating layer and the transparent inorganic insulating layer and (ii) the channel section and the gate electrode overlap each other via only the gate insulating layer.

This makes it possible to increase a film thickness between (i) the source and drain electrodes and (ii) the gate electrode while the film thickness between the channel section and the gate electrode is maintained at the same level as the conventional configuration. It is therefore possible to produce the transistor which can reduce parasitic capacitors without deteriorating characteristics of the transistor, as compared to the conventional configuration.

Moreover, according to the method, it is possible to produce the insulated gate transistor of the present invention without increasing the number of the manufacturing processes.

The present invention is not limited to the embodiments, but can be altered by a skilled person in the art within the scope of the claims. An embodiment derived from a proper combination of technical means disclosed in respective different embodiments is also encompassed in the technical scope of the present invention.

INDUSTRIAL APPLICABILITY

The insulated gate transistor and the liquid crystal display device of the present invention can be used as a product including a liquid crystal display device. In particular, the present invention is suitable for use in a liquid crystal display for a device such as a television, a mobile phone, and an in-vehicle instrument panel.

REFERENCE SIGNS LIST

1: Liquid crystal panel
2: Active matrix substrate (glass substrate, transparent insulating substrate)
3: Semiconductor integrated circuit chip
4: TCP film
5: Part or electrode terminal of scanning signal line (gate line, scanning line)
5A: Electrode terminal of transparent conductive scanning signal line
6: Part or electrode terminal of data signal line (source line, signal line)
6A: Electrode terminal of transparent conductive data signal line
9: Color filter substrate (second transparent insulating substrate, counter substrate)
10: Transistor (insulated gate transistor)
11: Scanning signal line (gate line, scanning line)
11A: Gate line, Gate electrode
12: Data signal line (signal line, source line, source electrode)
13: Liquid crystal layer (liquid crystal cell)
14: Counter electrode (common electrode)
15: Storage capacitor (auxiliary capacitor)
16: Storage capacitor line, common electrode line
21: Drain electrode (drain line, drain electrode)
22: Transparent conductive pixel electrode
30: Gate insulating layer (first SiNx layer, insulating layer)
31: (First) amorphous silicon layer containing no impurity
31A: Channel section (first amorphous silicon layer)
32: Protective insulating layer (etch-stop layer, second SiNx layer)
33: (Second) amorphous silicon layer containing impurity
34: Heat-resistant metal layer (Ti thin film layer)
34A: Heat-resistant metal layer (Ti thin film layer)
34B: Heat-resistant metal layer (Ti thin film layer)
35: Low-resistance metal layer (Al thin film layer or Cu thin film layer)
35A: Second metal layer
35B: Second metal layer (low-resistance metal layer)
36: Buffer conductive layer
37: Passivation insulating layer
40: Data signal line driving circuit
41: Scanning signal line driving circuit
42: Storage capacitor line driving circuit
43: Control circuit
50: Storage capacitor formation area
60: Transparent inorganic insulating resin (transparent inorganic insulating layer, insulating layer)
62: Opening (above drain electrode)
63: Opening (above part of scanning signal line)
64: Opening (above part of data signal line)
65: Opening (above storage capacitor line or common electrode line)
70: Liquid crystal panel
71: Active matrix substrate (first transparent insulating substrate)
80A: Photosensitive resin pattern formed by halftone exposure
80B: Photosensitive resin pattern formed by halftone exposure
83A: Photosensitive resin pattern formed by halftone exposure
83B: Photosensitive resin pattern formed by halftone exposure
83C1: Photosensitive resin pattern having a fluorinated surface
93: Colored layer (color filter)
100: Liquid crystal display device

The invention claimed is:

1. A method for producing an insulated gate transistor, said method comprising the steps of:
   (a) forming at least one metal layer on a main surface of a transparent insulating substrate;
   (b) forming a photosensitive resin pattern on the at least one metal layer so that the photosensitive resin pattern has a thickness which is thicker in an area corresponding to a gate electrode than in an area corresponding to source and drain formation areas;
   (c) selectively forming a gate electrode pattern, made up of the at least one metal layer, with use of the photosensitive resin pattern;
   (d) exposing the at least one metal layer in the source and drain formation areas above respective edge parts of the gate electrode, by reducing a thickness of the photosensitive resin pattern;
   (e) fluorinating a surface of the photosensitive resin pattern, whose thickness has been reduced, by dry etching with fluorine gas;
   (f) applying transparent inorganic insulating resin onto the surface which has been fluorinated in the step (e);
   (g) removing the photosensitive resin pattern, which has been fluorinated;
   (h) forming at least a gate insulating layer and a semiconductor layer; and
   (i) forming source and drain lines so that (a) the source and drain lines and (b) the source and drain formation areas, respectively, overlap each other.

2. A method for producing an active matrix substrate in which a transparent insulating substrate has a main surface on which unit pixels are two-dimensionally provided in a matrix manner, each of the unit pixels including (i) an insulated gate transistor, which is a channel-etch insulated gate transistor with a gate electrode, a source electrode, and a drain electrode, (ii) a scanning signal line serving also as the gate electrode, (iii) a data signal line serving also as the source electrode, and (iv) a pixel electrode which is connected with a drain line serving also as the drain electrode,
said method comprising the steps of:
   (a) forming at least one metal layer on a main surface of a transparent insulating substrate;
   (b) forming a photosensitive resin pattern on the at least one metal layer so that the photosensitive resin pattern has a thickness which is thicker in an area corresponding to the gate electrode than in an area corresponding to source and drain formation areas;

(c) selectively forming a gate electrode pattern, made up of the at least one metal layer, with use of the photosensitive resin pattern;

(d) exposing the at least one metal layer in the source and drain formation areas above respective edge parts of the gate electrode, by reducing a thickness of the photosensitive resin pattern;

(e) fluorinating a surface of the photosensitive resin pattern, whose thickness has been reduced, by dry etching with fluorine gas;

(f) applying transparent inorganic insulating resin onto the surface which has been fluorinated in the step (e);

(g) removing the photosensitive resin pattern, which has been fluorinated;

(h) forming at least a gate insulating layer and a semiconductor layer;

(i) forming source and drain lines so that (a) the source and drain lines and (b) the source and drain formation areas, respectively, overlap each other;

(j) forming a passivation insulating layer after the step (i);

(k) forming an opening in the passivation insulating layer, the opening being provided partially above the drain electrode; and (l) forming a transparent conductive layer, serving as a pixel electrode, on the passivation insulating layer and in the opening.

3. A method for producing a liquid crystal display device, said liquid crystal display device including:

an active matrix substrate having a main surface on which unit pixels are two-dimensionally provided in a matrix manner, each of the unit pixels including (i) an insulated gate transistor, which is a channel-etch insulated gate transistor with a gate electrode, a source electrode, and a drain electrode, (ii) a scanning signal line serving also as the gate electrode, (iii) a data signal line serving also as the source electrode, and (iv) a pixel electrode which is connected with a drain line serving also as the drain electrode;

a counter substrate or a color filter which faces the first transparent insulating substrate; and liquid crystal provided between the active matrix substrate and the counter substrate or the color filter, said method comprising the steps of:

(a) forming at least one metal layer on a main surface of a transparent insulating substrate included in the active matrix substrate;

(b) forming a photosensitive resin pattern on the at least one metal layer so that the photosensitive resin pattern has a thickness which is thicker in an area corresponding to the gate electrode than in an area corresponding to source and drain formation areas;

(c) selectively forming a gate electrode pattern, made up of the at least one metal layer, with use of the photosensitive resin pattern;

(d) exposing the at least one metal layer in the source and drain formation areas above respective edge parts of the gate electrode, by reducing a thickness of the photosensitive resin pattern;

(e) fluorinating a surface of the photosensitive resin pattern, whose thickness has been reduced, by dry etching with fluorine gas;

(f) applying transparent inorganic insulating resin onto the surface which has been fluorinated in the step (e);

(g) removing the photosensitive resin pattern, which has been fluorinated;

(h) forming at least a gate insulating layer and a semiconductor layer;

(i) forming source and drain lines so that (a) the source and drain lines and (b) the source and drain formation areas, respectively, overlap each other;

(j) forming a passivation insulating layer after the step (i);

(k) forming an opening in the passivation insulating layer, the opening being provided partially above the drain electrode; and (l) forming a transparent conductive layer, serving as a pixel electrode, on the passivation insulating layer and in the opening.

* * * * *